(12) United States Patent
Muramoto et al.

(10) Patent No.: US 7,462,913 B2
(45) Date of Patent: Dec. 9, 2008

(54) SEMICONDUCTOR DEVICE HAVING FIRST AND SECOND SEPARATION TRENCHES

(75) Inventors: Hidetoshi Muramoto, Okazaki (JP);
Akira Yamada, Nukata-gun (JP);
Tomohisa Suzuki, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/586,734

(22) Filed: Oct. 26, 2006

(65) Prior Publication Data
US 2007/0090458 A1   Apr. 26, 2007

(30) Foreign Application Priority Data
Oct. 26, 2005 (JP) .............................. 2005-311675
Feb. 28, 2006 (JP) .............................. 2006-051854
Jul. 19, 2006 (JP) .............................. 2006-197097

(51) Int. Cl.
*H01L 27/12* (2006.01)
(52) U.S. Cl. ............... 257/347; 257/239; 257/E21.567; 257/E21.112; 257/E21.703
(58) Field of Classification Search ................. 257/347, 257/239
See application file for complete search history.

(56) References Cited

U.S. PATENT DOCUMENTS 5,736,774 A   4/1998 Fujihira

2004/0141352 A1*   7/2004 Dufourt et al. ................. 365/72
2006/0087343 A1    4/2006 Himi et al.
2006/0197156 A1*   9/2006 Amaratunga et al. ......... 257/347
2006/0231868 A1*  10/2006 Yamada et al. ............... 257/239

OTHER PUBLICATIONS

U.S. Appl. No. 11/405,399, filed Apr. 18, 2006, Yamada et al.
U.S. Appl. No. 11/526,652, filed Sep. 26, 2006, Yamada.
S. Merchant et al., "*Realization of High Breakdown Voltage (>700V) In Thin SOI Devices*", IEEE, 1991, pp. 31-35.
H. Akiyama et al., "*A High Breakdown Voltage IC with Lateral Power Device based on SODI structure*", Proceedings of 2004 International Symposium on Power Semiconductor Devices & ICs, Kitakyushu, 2004, pp. 375-378 (Discussed on p. 1 of the spec.).

* cited by examiner

*Primary Examiner*—Ahmed Sefer
(74) *Attorney, Agent, or Firm*—Posz Law Group, PLC

(57) ABSTRACT

A semiconductor device includes: a SOI substrate having a SOI layer, a buried oxide layer and a support substrate; multiple first separation trenches on the SOI layer; multiple MOS transistors, each of which is surrounded with one first separation trench; a second separation trench on the SOI layer including n-ply field trenches; and multiple field regions such that a k-th field region is surrounded with a k-th field trench. One MOS transistor is disposed in each field region. The MOS transistors are connected in series. The first MOS transistor has a gate terminal as an input terminal. The n-th MOS transistor is connected to the power source potential through an output resistor. The n-th field region has an electric potential, which is fixed to the power source potential.

17 Claims, 33 Drawing Sheets

FIG. 9

| SIGN | SIMULATION SET VALUE |
|---|---|
| C_box | 5pF |
| C_d | 1pF |
| C_div | 1pF |
| C_field_hv | 100pF |
| C_field_lv | 100pF |
| C_k | 1pF |
| C_s | 1pF |
| C_trench | 3pF |
| R_div | 1MΩ |
| R_in | 300kΩ |
| R_out | 100kΩ |
| R_sub | 0.01Ω, 40Ω, 1kΩ, 10kΩ, 100kΩ, 1MΩ, 10MΩ, 1TΩ |
| R_well | 10Ω |

| THICKNESS OF BURIED OXIDE FILM [μm] | C_box [pF] | C_field_hv [pF] | C_field_lv [pF] |
|---|---|---|---|
| 3 | 5 | 100 | 100 |
| 5 | 3 | 60 | 60 |
| 10 | 1.5 | 30 | 30 |
| 12 | 1.25 | 25 | 25 |
| 20 | 0.75 | 15 | 15 |
| 50 | 0.3 | 6 | 6 |

SEMICONDUCTOR DEVICE HAVING FIRST AND SECOND SEPARATION TRENCHES

CROSS REFERENCE TO RELATED APPLICATIONS

This application is based on Japanese Patent Applications No. 2005-311675 filed on Oct. 26, 2005, No. 2006-51854 filed on Feb. 28, 2006, and No. 2006-197097 filed on Jul. 19, 2006, the disclosures of which are incorporated herein by reference.

FIELD OF THE INVENTION

The present invention relates to a semiconductor device having first and second separation trenches.

BACKGROUND OF THE INVENTION

A high voltage IC for use in driving an inverter, or the like is disclosed in, for example, U.S. Pat. No. 5,736,774 or Proc. of ISPSD 2004, p. 385, H. Akiyama, et al. Mitsubishi Electric Co., Ltd.

FIG. 31 shows a schematic sectional view of a prior-art high voltage IC 90 which employs an SOI substrate and trench separation.

In the high voltage IC 90 shown in FIG. 31, a low potential (GND) reference circuit, a high potential (floating) reference circuit and a level shift circuit are respectively provided in the SOI layer 1a of an SOI substrate 1 having a buried oxide film 3. Besides, respective regions for forming the GND reference circuit, floating reference circuit and level shift circuit are insulatingly (dielectrically) separated by the buried oxide film 3 of the SOI substrate 1 and the sidewall oxide films 4s of trenches 4. Incidentally, the buried oxide film 3 is underlaid with a thick support substrate 2 made of silicon (Si), and the SOI substrate 1 is formed by the sticking of the substrates.

In the level shift circuit of the high voltage IC 90, a circuit element of high breakdown voltage is required for joining the low potential reference circuit and the high potential reference circuit. A lateral MOS transistor (LDMOS) 9 in the level-shift-circuit forming region shown in FIG. 31 adopts a so-called "SOI-RESURF structure" in order to ensure a breakdown voltage.

A high voltage in the level shift circuit is applied to the drain D of the LDMOS 9 as shown in the figure. In the LDMOS 9 in FIG. 31, the breakdown voltage in the lateral direction of a section is ensured by the SOI-RESURF structure, which is formed by a surface p-type impurity layer and the buried oxide film 3. Besides, regarding a breakdown voltage in the vertical direction of the section, a high voltage applied between the drain D and a ground (GND) is divided by the SOI layer 1a of low concentration and the buried oxide film 3, thereby to moderate an electric field in the SOI layer 1a.

In the semiconductor device wherein an insulatingly separated LDMOS like the LDMOS 9 in FIG. 31 is formed in the SOI layer on the buried oxide film, the impurity concentration and thickness of the SOI layer and the thickness of the buried oxide film need to be optimally designed for the purpose of ensuring the breakdown voltage in the vertical direction of the section.

However, when a high breakdown voltage of or above 1000 V is to be attained by this method, a buried oxide film thicker than 5 µm and an SOI layer thicker than 50 µm are required. On the other hand, the achievable upper-limit thickness of the buried oxide film is about 5 µm in the present situation, in relation to the warp of the SOI substrate, etc. Besides, the thickness of the SOI layer is usually on the order of several µm to 20 µm, and when the SOI layer is thickened, a trench working load increases. With the LDMOS 9 in the level-shift-circuit forming region in FIG. 31, therefore, it is a limitation to ensure a breakdown voltage of about 600 V, and a breakdown voltage of 1200 V as is required in a 400V power source system, an EV automobile, etc. cannot be ensured.

In order to solve the above problem, another semiconductor device 10 to be described below has been proposed as a related art.

FIG. 32 is a fundamental equivalent circuit diagram of the semiconductor device 10.

In the semiconductor device 10 shown in FIG. 32, n (n≧2) transistor elements $Tr_1$-$Tr_n$ which are insulatingly separated from one another are successively connected in series between a ground (GND) potential and a predetermined potential Vs, with a first stage being the side of the GND potential and with the nth stage being the side of the predetermined potential Vs. The gate terminal of the transistor element $Tr_1$ of the first stage serves as the input terminal of the semiconductor device 10. The output of the semiconductor device 10 is derived from the terminal on the side of the predetermined potential Vs in the transistor element $Tr_n$ of the nth stage, and through a load resistor (not shown) having a predetermined resistance. Incidentally, an output signal is derived in a state where a reference potential has been converted (level-shifted) from the GND potential of an input signal to the predetermined potential Vs, whereby the output signal has been inverted relative to the input signal.

In the operation of the semiconductor device 10 in FIG. 32, the voltage between the GND potential and the predetermined potential Vs is divided by the n transistor elements $Tr_1$-$Tr_n$, and the respective transistor elements $Tr_1$-$Tr_n$ of the first to nth stages bear corresponding voltage ranges. Accordingly, a breakdown voltage required of each of the transistor elements $Tr_1$-$Tr_n$ becomes substantially one nth as compared with a breakdown voltage in the case where the voltage between the GND potential and the predetermined potential Vs is borne by a single transistor element. Accordingly, even transistor elements which can be inexpensively manufactured by employing a general manufacturing method and each of which has an ordinary breakdown voltage can form a semiconductor device which ensures a high breakdown voltage required as a whole, by appropriately setting the number n of the transistor elements in the semiconductor device 10 in FIG. 32. By the way, in the semiconductor device 10 in FIG. 32, the n transistor elements $Tr_1$-$Tr_n$ should preferably have the same breakdown voltages. Thus, the voltages (breakdown voltages) which the respective transistor elements $Tr_1$-$Tr_n$ inserted between the GND potential and the predetermined potential bear can be equalized and minimized.

Concretely, by way of example, a MOS transistor element having a breakdown voltage of about 150 V can be easily formed by the general manufacturing method, by employing an SOI substrate that includes a buried oxide film having a thickness of about 2 µm. Accordingly, a semiconductor device of high breakdown voltage can be realized in such a way that the n transistor elements $Tr_1$-$Tr_n$ which are insulatingly separated from one another by insulating separation trenches are formed on the SOI substrate, so as to constitute the semiconductor device 10 which consists of the transistor elements of the n stages connected in series. By way of example, the transistor elements each having the breakdown voltage of 150 V are connected in series in two stages, four stages and eight stages as shown in FIG. 32, whereby semiconductor devices 10 having breakdown voltages of 300V, 600V and 1200V can be formed, respectively. Accordingly, a wafer structure (the thicknesses of an SOI layer and the buried oxide film, the impurity concentration of the SOI layer, etc.) need not be altered in accordance with the breakdown voltages. Besides, the working depths of the insulating separation trenches are constant, and even a required breakdown voltage of or above 1000 V can be easily incarnated.

In the above way, the semiconductor device 10 shown in FIG. 32 can ensure any required breakdown voltage, and it can be inexpensively manufactured by employing the general manufacturing method for semiconductor devices.

FIG. 33 is a diagram showing in detail a level shift circuit portion and a floating-reference-gate drive circuit portion in a high voltage IC 100, and it is a diagram showing the arrangement of the respective circuit elements of the semiconductor device 10 applied to the level shift circuit and shown in the fundamental equivalent circuit diagram of FIG. 32. FIG. 34 is a sectional view taken along line XXXIV-XXXIV in FIG. 33, and it is a view showing the structures of the respective transistor elements.

As shown in the sectional view of FIG. 34, in the high voltage IC 100, then transistor elements $Tr_1$-$Tr_n$ in the semiconductor device 10 in FIG. 32 as is applied to the level shift circuit are formed in the N conductive type SOI layer 1a of an SOI structure semiconductor substrate 1 having a buried oxide film 3. Incidentally, the buried oxide film 3 is underlaid with a thick support substrate 2 made of silicon (Si), and the SOI substrate 1 is formed by the sticking of the substrates.

The n transistor elements $Tr_1$-$Tr_n$ are LDMOS (Lateral Double-diffused MOS) transistor elements, and they are insulatingly separated from one another by insulating separation trenches 4 which reach the buried oxide film 3.

As shown in FIG. 33, in the semiconductor device 10 of the high voltage IC 100, n-ply (n-fold) insulating separation trenches $T_1$-$T_n$ are formed, and the n transistor elements $Tr_1$-$Tr_n$ insulatingly separated from one another are successively arranged one by one in respective field regions surrounded with the n-ply insulating separation trenches $T_1$-$Tr_n$, in such a manner that the transistor elements of the respective stages are included in the corresponding field regions. Thus, voltages which are applied to the respective field regions surrounded with the n-ply insulating separation trenches are equalized in accordance with voltage increases from the GND potential to the predetermined potential, and the voltage ranges to be borne by then transistor elements $Tr_1$-$Tr_n$ can be shifted in due order from the GND potential toward the predetermined potential. Incidentally, only one of the n-ply insulating separation trenches $T_1$-$T_n$ exists between the respectively adjacent transistor elements. Therefore, the connection wiring operations of the n transistor elements $Tr_1$-$Tr_n$ are facilitated, and the semiconductor device 10 can be made small in size by reducing an occupation area.

As stated above, in the semiconductor device 10, the n transistor elements $Tr_1$-$Tr_n$ may be the transistor elements each having the ordinary breakdown voltage. Thus, the high voltage IC 100 shown in FIG. 33 can ensure a breakdown voltage of 1200V, and it is a high voltage IC suitable for driving the inverter of an on-vehicle motor or for driving the inverter of an on-vehicle air conditioner. Incidentally, the above proposed techniques have already been applied for Japanese Patent Applications No. 2004-308724, No. 2005-121306 and No. 2005-227058.

Meanwhile, characteristics in the case where a dV/dt surge entered in applying the semiconductor device 10 shown in FIG. 32, to the level shift circuit portion of the high voltage IC 100, were simulated. As a result, it has been revealed that a problem to be stated below is existent.

FIG. 35 is a diagram showing the configuration of a semiconductor device 11 into which the semiconductor device 10 shown in FIG. 33 has been simplified. FIG. 36 is an equivalent circuit diagram of the semiconductor device 11 as was employed in the simulation. FIG. 37 is a diagram showing simulation results, namely, the changes-with-time of potentials at the individual points of the semiconductor device 11 attributed to the surge input.

An SOI substrate having a buried oxide film is employed for the semiconductor device 11 shown in FIG. 35, and six lateral MOS transistors (LDMOSS) 11t are formed in an SOI layer on the buried oxide film. Each LDMOS 11t has a pattern in which a drain D, a gate G and a source S are concentrically arranged as shown in the figure. Besides, each LDMOS 11t is surrounded with a first insulating separation trench Z1 which reaches the buried oxide film and which is indicated by a circle of thick solid line in the figure, thereby to be insulatingly separated from the environs.

In the semiconductor device 11 in FIG. 35, second insulating separation trenches Z2 which similarly reach the buried oxide film and which are indicated by squares of thick solid lines in the figure are formed in multiple fashion. The LDMOSs 11t insulatingly separated by the first insulating separation trenches Z1 are respectively arranged one by one in corresponding field regions F1-F6 surrounded with the multiple second insulating separation trenches Z2. Incidentally, a field region Fh which lies inside the field region F6 is a region where a high voltage (HV) circuit, a power source pad, an output pad, etc. are formed, and a field region Fg which lies outside the field region F1 is a region where a ground (GND) pad, an input pad, etc. are formed.

In the semiconductor device 11 in FIG. 35, the six LDMOSs 11t are successively connected in series between a ground (GND) potential and a predetermined power source potential, with a first stage of GND potential side being the outer peripheral side of the sextuple second insulating separation trenches Z2 and with a sixth stage of power source potential side being the inner peripheral side thereof. Incidentally, sign $R_{in}$ denotes an input resistor, and sign $R_{out}$ denotes an output resistor. In the semiconductor device 11, a gate terminal in the first-stage LDMOS lit is used as an input terminal. Besides, the output resistor $R_{out}$ is connected between the sixth-stage LDMOS 11t and the power source pad, and an output is derived from between the terminal of the sixth-stage LDMOS 11t on the power source potential side thereof and the output resistor $R_{out}$. In the semiconductor device 11, combinations each of which consists of a resistance element R and a capacitance element C that are connected in parallel are connected in series in multiple stages, thereby to divide the voltage between the GND potential and the power source potential, and the gates of the LDMOSs 11t of the second stage are respectively connected to the branch points of the series connection.

As shown in an equivalent circuit in FIG. 36, in the simulation of the semiconductor device 11 at the application of the dV/dt surge, the equivalent circuit is constituted by gate connection lines each consisting of the resistance element R and the capacitance element C, the source-drain lines of the LDMOSs 11t, SOI layer lines and support substrate lines, in consideration of parasitic capacitances, etc. which develop in the SOI substrate.

FIG. 37 shows the simulation results of the semiconductor device 11 in the case where the dV/dt surge of 100 kV/μsec entered. In FIG. 37, there are shown the change-with-time graphs of potentials at the output pad, the drains Ds of the LDMOSs 11t of the respective stages, and the power source side of the input resistor $R_{in}$. The change-with-time of the output pad potential is the same as the change-with-time of the input dV/dt surge. By the way, in FIG. 37, the drains Ds of the fifth and sixth stages have an identical potential, and no voltage is applied across the LDMOS 11t of the sixth stage. This is ascribable to the circuit arrangement shown in FIG. 36, and is not an essential problem.

In the semiconductor device 11 in a steady state, as stated before, the power source voltage can be equally divided by the six transistor elements 11t. In contrast, as shown in FIG. 37, in the case where the dV/dt surge of 100 kV/μsec entered, a large potential difference develops between the output pad and the drain D of the LDMOS 11t of the sixth stage. That is, a large voltage is applied across the output resistor $R_{out}$, and the output resistor $R_{out}$ will break down.

SUMMARY OF THE INVENTION

In view of the above-described problem, it is an object of the present disclosure to provide a semiconductor device having first and second separation trenches.

According to a first aspect of the present disclosure, a semiconductor device includes: a SOI substrate having a SOI layer, a buried oxide layer and a support substrate, which are stacked in this order; a plurality of first separation trenches disposed on the SOI layer and reaching the buried oxide layer; a plurality of MOS transistors, each of which is surrounded with one of the first separation trenches so that the MOS transistor is isolated; a second separation trench disposed on the SOI layer and reaching the buried oxide layer, wherein the second separation trench includes a plurality of field trenches, which are defined as first to n-th field trenches so that the second separation trench provides n-ply field trenches, and wherein n represents a predetermined natural number; and a plurality of field regions surrounded with the second separation trench, wherein the field regions are defined as first to n-th field regions so that a k-th field region is surrounded with a k-th field trench, and wherein k is a natural number in a range between 1 and n. One of the MOS transistors surrounded with one of the first separation trenches is disposed in each field region so that a k-th MOS transistor is disposed in the k-th field region. The MOS transistors are electrically connected in series between a ground potential and a predetermined power source potential. The first field region is disposed on an utmost outside and on a ground potential side, and the n-th field region is disposed on an utmost inside and on a power source potential side. The first MOS transistor in the first field region has a gate terminal, which provides an input terminal. The n-th MOS transistor in the n-th field region is electrically connected to the power source potential through an output resistor so that an output signal is retrieved from a connection between the n-th MOS transistor and the output resistor. The n-th field region has an electric potential, which is fixed to the power source potential.

In the above device, since the electric potential between the ground potential and the predetermined potential is divided by multiple transistors so that a required DC breakdown voltage in each transistor is reduced. Further, even when a dV/dt surge is inputted into an output side of the device, the surge voltage is not largely applied to the output resistor. Thus, the above device has a sufficient breakdown voltage and, the device is protected from damaging by the surge even when the surge is introduced into the device.

According to a second aspect of the present disclosure, a semiconductor device includes: a SOI substrate having a SOI layer, a buried oxide layer and a support substrate, which are stacked in this order; a plurality of first separation trenches disposed on the SOI layer and reaching the buried oxide layer; a plurality of MOS transistors, each of which is surrounded with one of the first separation trenches so that the MOS transistor is isolated; a second separation trench disposed on the SOI layer and reaching the buried oxide layer, wherein the second separation trench includes a plurality of field trenches, which are defined as first to n-th field trenches so that the second separation trench provides n-ply field trenches, and wherein n represents a predetermined natural number; a plurality of field regions surrounded with the second separation trench, wherein the field regions are defined as first to n-th field regions so that a k-th field region is surrounded with a k-th field trench, and wherein k is a natural number in a range between 1 and n; and a hollow disposed in a part of the support substrate, the part which faces all field regions through the buried oxide layer. One of the MOS transistors surrounded with one of the first separation trenches is disposed in each field region so that a k-th MOS transistor is disposed in the k-th field region. The MOS transistors are electrically connected in series between a ground potential and a predetermined power source potential. The first field region is disposed on an utmost outside and on a ground potential side, and the n-th field region is disposed on an utmost inside and on a power source potential side. The first MOS transistor in the first field region has a gate terminal, which provides an input terminal. The n-th MOS transistor in the n-th field region is electrically connected to the power source potential through an output resistor so that an output signal is retrieved from a connection between the n-th MOS transistor and the output resistor. The hollow reaches the buried oxide layer.

In the above device, since the hollow is disposed to face the field region, an electric potential is not locally applied to the output resistor. Thus, the breakdown voltage against the surge is improved. Further, the electric potential between the ground potential and the predetermined potential is divided by multiple transistors so that a required DC breakdown voltage in each transistor is reduced. The above device has a sufficient breakdown voltage and, the device is protected from damaging by the surge even when the surge is introduced into the device.

According to a third aspect of the present disclosure, a semiconductor device includes: a SOI substrate having a SOI layer and an insulation substrate, which are stacked in this order; a plurality of first separation trenches disposed on the SOI layer and reaching the insulation substrate; a plurality of MOS transistors, each of which is surrounded with one of the first separation trenches so that the MOS transistor is isolated; a second separation trench disposed on the SOI layer and reaching the insulation substrate, wherein the second separation trench includes a plurality of field trenches, which are defined as first to n-th field trenches so that the second separation trench provides n-ply field trenches, and wherein n represents a predetermined natural number; and a plurality of field regions surrounded with the second separation trench, wherein the field regions are defined as first to n-th field regions so that a k-th field region is surrounded with a k-th field trench, and wherein k is a natural number in a range between 1 and n. One of the MOS transistors surrounded with one of the first separation trenches is disposed in each field region so that a k-th MOS transistor is disposed in the k-th field region. The MOS transistors are electrically connected in series between a ground potential and a predetermined power source potential. The first field region is disposed on an utmost outside and on a ground potential side, and the n-th field region is disposed on an utmost inside and on a power source potential side. The first MOS transistor in the first field region has a gate terminal, which provides an input terminal. The n-th MOS transistor in the n-th field region is electrically connected to the power source potential through an output resistor so that an output signal is retrieved from a connection between the n-th MOS transistor and the output resistor.

In the above device, the electric potential between the ground potential and the predetermined potential is divided by multiple transistors so that a required DC breakdown voltage in each transistor is reduced. Further, since the SOI substrate includes the insulation substrate, the surge current is not introduced into the insulation substrate. Accordingly, the electric potential is not locally applied to the output resistor, so that the breakdown voltage against the surge is improved. The above device has a sufficient breakdown voltage and, the device is protected from damaging by the surge even when the surge is introduced into the device.

According to a fourth aspect of the present disclosure, a semiconductor device includes: a SOI substrate having a SOI layer, a buried oxide layer and a support substrate, which are stacked in this order; a plurality of first separation trenches disposed on the SOI layer and reaching the buried oxide layer; a plurality of MOS transistors, each of which is surrounded with one of the first separation trenches so that the MOS transistor is isolated; a second separation trench disposed on the SOI layer and reaching the buried oxide layer, wherein the second separation trench includes a plurality of field trenches, which are defined as first to n-th field trenches so that the second separation trench provides n-ply field trenches, and wherein n represents a predetermined natural number; and a plurality of field regions surrounded with the second separation trench, wherein the field regions are defined as first to n-th field regions so that a k-th field region is surrounded with a k-th field trench, and wherein k is a natural number in a range between 1 and n. One of the MOS transistors surrounded with one of the first separation trenches is disposed in each field region so that a k-th MOS transistor is disposed in the k-th field region. The MOS transistors are electrically connected in series between a ground potential and a predetermined power source potential. The first field region is disposed on an utmost outside and on a ground potential side, and the n-th field region is disposed on an utmost inside and on a power source potential side. The first MOS transistor in the first field region has a gate terminal, which provides an input terminal. The n-th MOS transistor in the n-th field region is electrically connected to the power source potential through an output resistor so that an output signal is retrieved from a connection between the n-th MOS transistor and the output resistor. The buried oxide layer has a relative dielectric constant smaller than 3.9.

In the above device, the electric potential between the ground potential and the predetermined potential is divided by multiple transistors so that a required DC breakdown voltage in each transistor is reduced. Further, since the relative dielectric constant of the buried oxide layer is smaller than that of silicon oxide, the surge current is prevented from introducing into the insulation substrate. Accordingly, the electric potential is not locally applied to the output resistor, so that the breakdown voltage against the surge is improved. The above device has a sufficient breakdown voltage and, the device is protected from damaging by the surge even when the surge is introduced into the device.

BRIEF DESCRIPTION OF THE DRAWINGS

The above and other objects, features and advantages of the present invention will become more apparent from the following detailed description made with reference to the accompanying drawings. In the drawings:

FIG. 9 is a table showing circuit constant used for simulation;

DETAILED DESCRIPTION OF THE PREFERRED EMBODIMENTS

Figure 1:
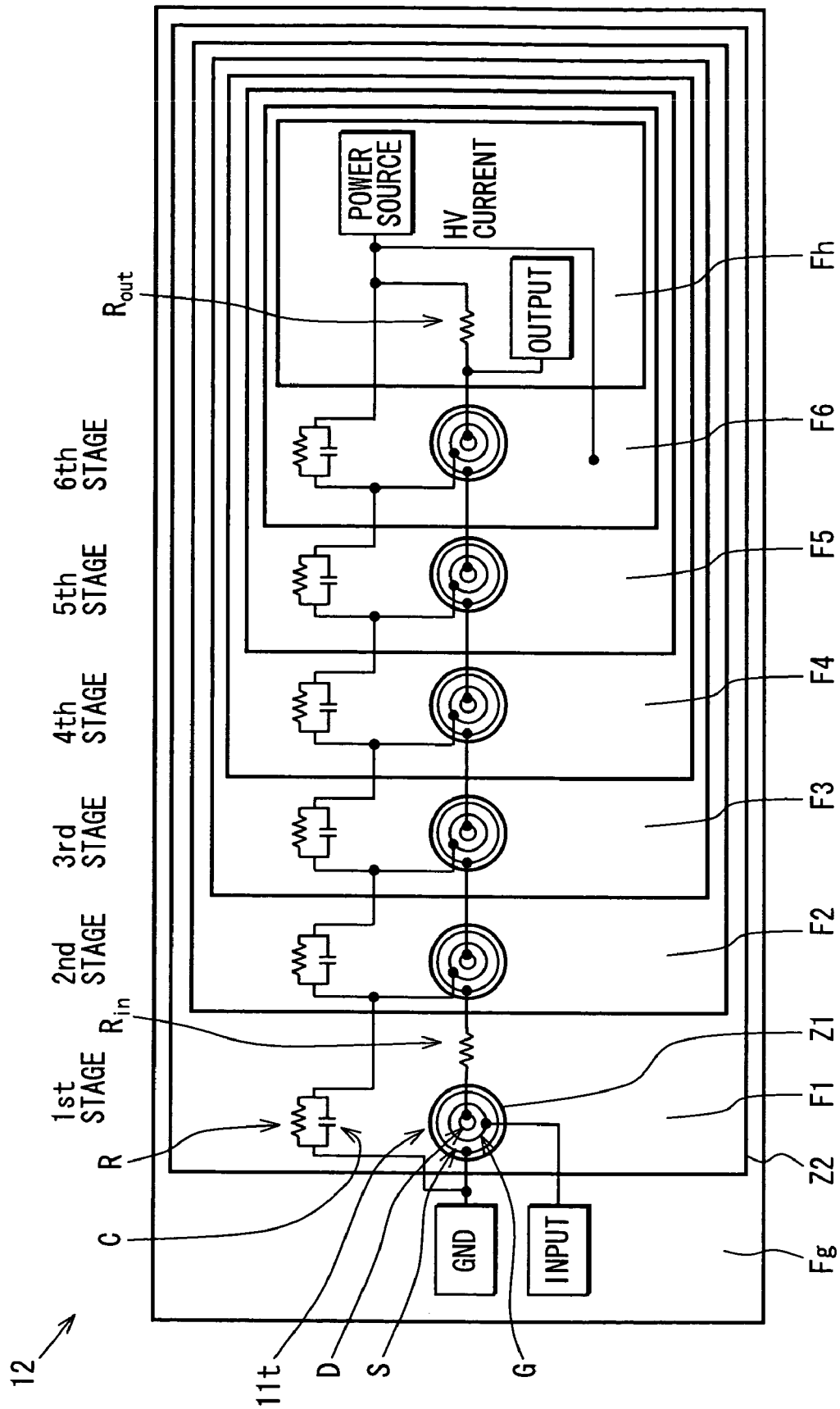
FIG. 1 is a schematic view showing a semiconductor device.
Figure 2:
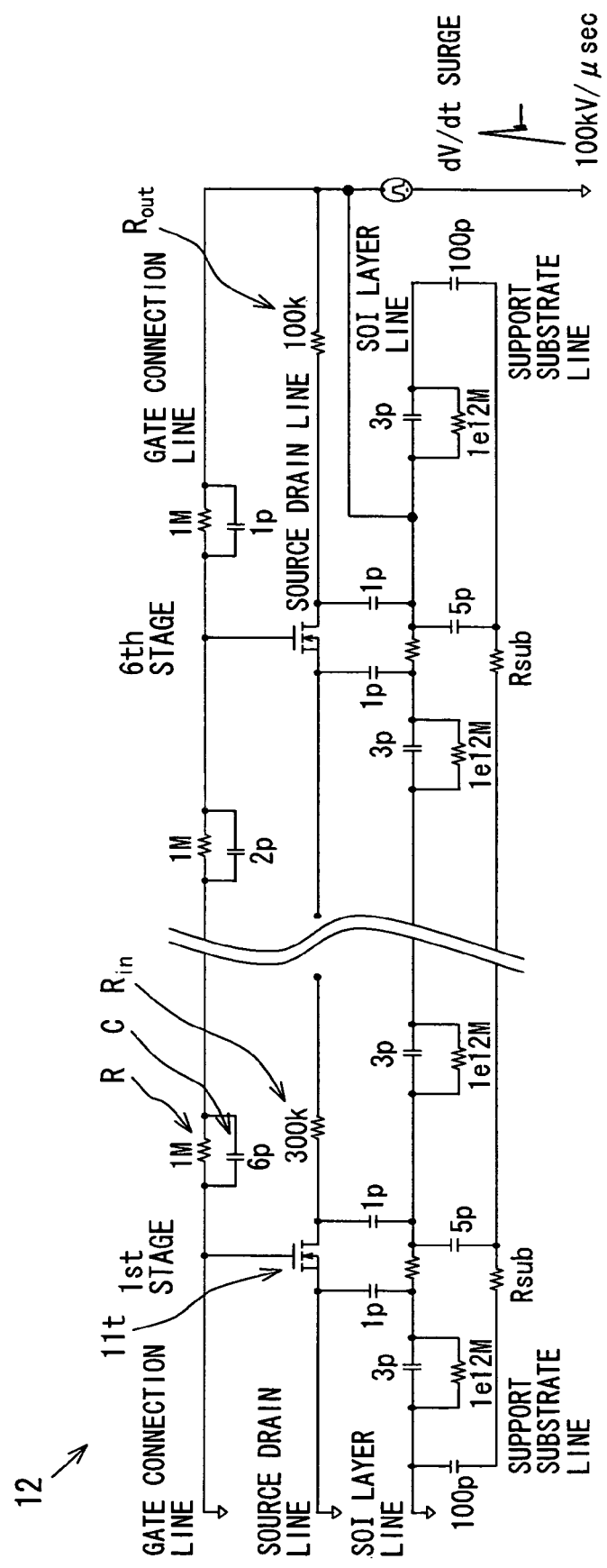
FIG. 2 is a circuit diagram showing the semiconductor device, which is used for simulation.
Figure 3:
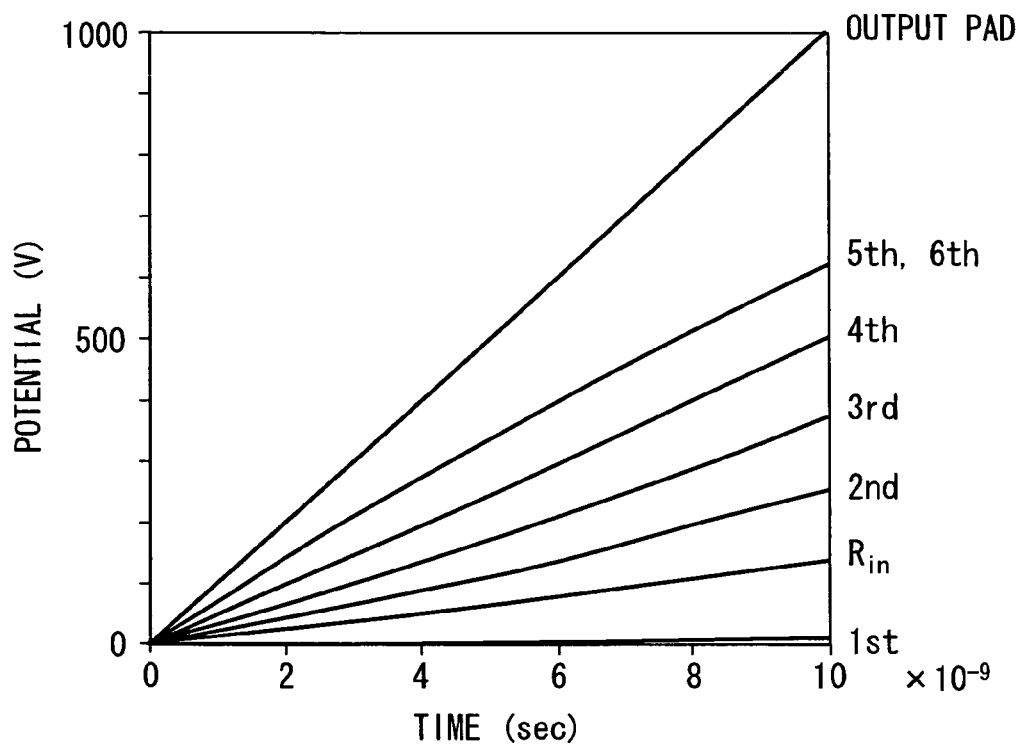
FIG. 3 is a graph showing a relation ship between a potential at each stage in the device and elapsed time in a case where a field region F6 is fixed at a power source potential.

FIG. 1 is a diagram showing the configuration of a semiconductor device 12, which is an embodiment of the semiconductor device. FIG. 2 is an equivalent circuit diagram, which was employed for the simulation of the characteristics of the semiconductor device 12 shown in FIG. 1. FIG. 3 is a diagram showing simulation results, namely, the changes-with-time of potentials at the individual points of the semiconductor device 12 as are attributed to a surge input. In FIG. 3, 1st represents a first stage drain, 2nd represents a second stage drain, 3rd represents a third stage drain, 4th represents a fourth stage drain, 5th represents a fifth stage drain, 6th represents a sixth stage drain, Rin represents a power source side input resistor, and output pad represents an output pad, in which the dV/dt surge is inputted.

Figure 35:
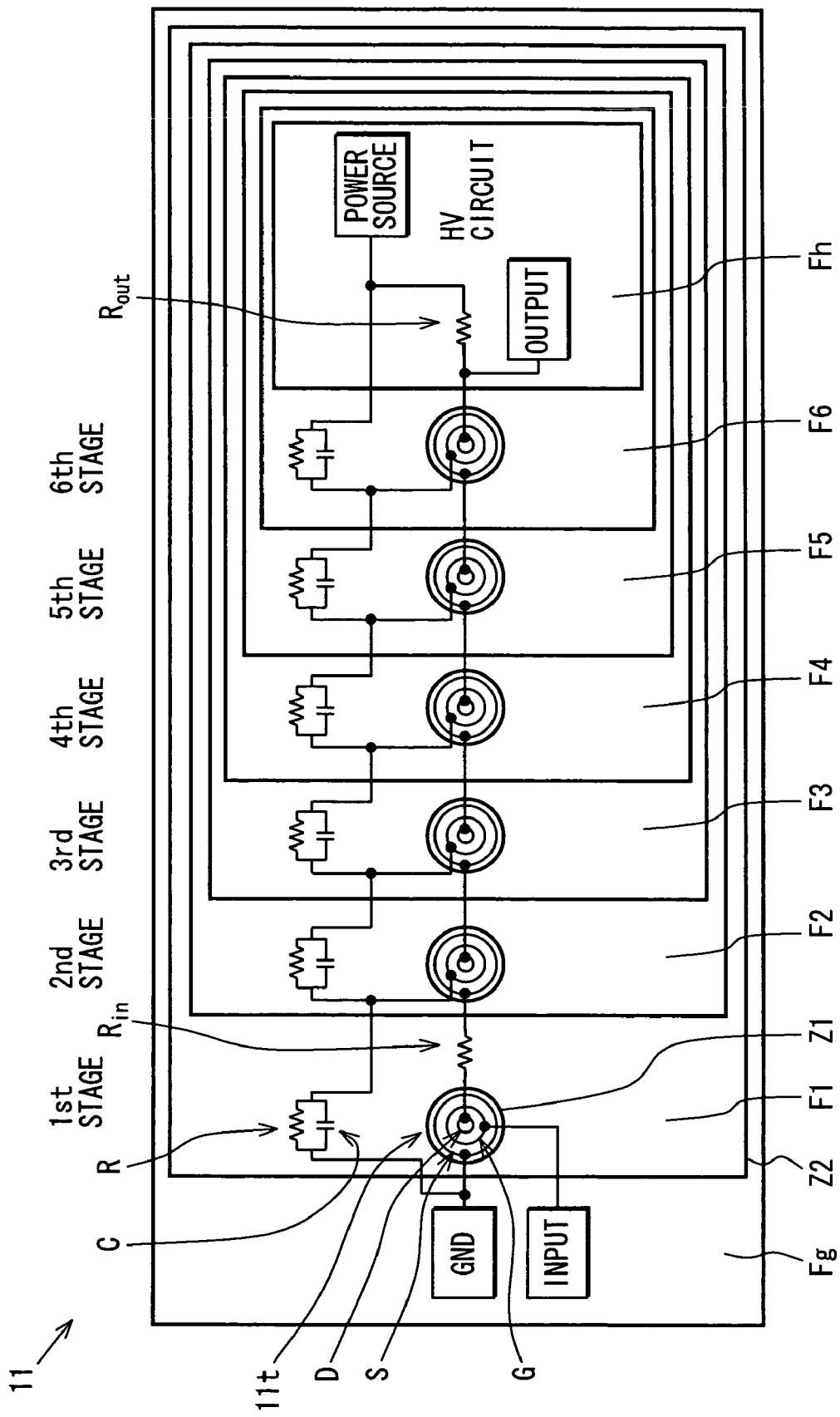
FIG. 35 is a schematic view showing the device in FIG. 33.

The semiconductor device 12 shown in FIG. 1 is substantially similar in configuration to the semiconductor device 11 shown in FIG. 35.

More specifically, as in the semiconductor device 11 shown in FIG. 35, an SOI substrate including a buried oxide film is employed for the semiconductor device 12 shown in FIG. 1, and six lateral MOS transistors (LDMOSS) 11t are formed in an SOI layer on the buried oxide film. Each LDMOS 11t has a pattern in which a drain D, a gate G and a source S are concentrically arranged as shown in the figure. Besides, each LDMOS 11t is surrounded with a first insulating separation trench Z1 which reaches the buried oxide film and which is indicated by a circle of thick solid line in the figure, thereby to be insulatingly separated from the environments.

As in the semiconductor device 11 shown in FIG. 35, in the semiconductor device 12 shown in FIG. 1, second insulating separation trenches Z2 which similarly reach the buried oxide film and which are indicated by squares of thick solid lines in the figure are formed in multiple fashion. The LDMOSs 11t insulatingly separated by the first insulating separation trenches Z1 are respectively arranged one by one in corresponding field regions F1 -F6 surrounded with the multiple second insulating separation trenches Z2. Incidentally, a field region Fh which lies inside the field region F6 is a region where a high voltage (HV) circuit, a power source pad, an output pad, etc. are formed, and a field region Fg which lies outside the field region F1 is a region where a ground (GND) pad, an input pad, etc. are formed.

Figure 34:
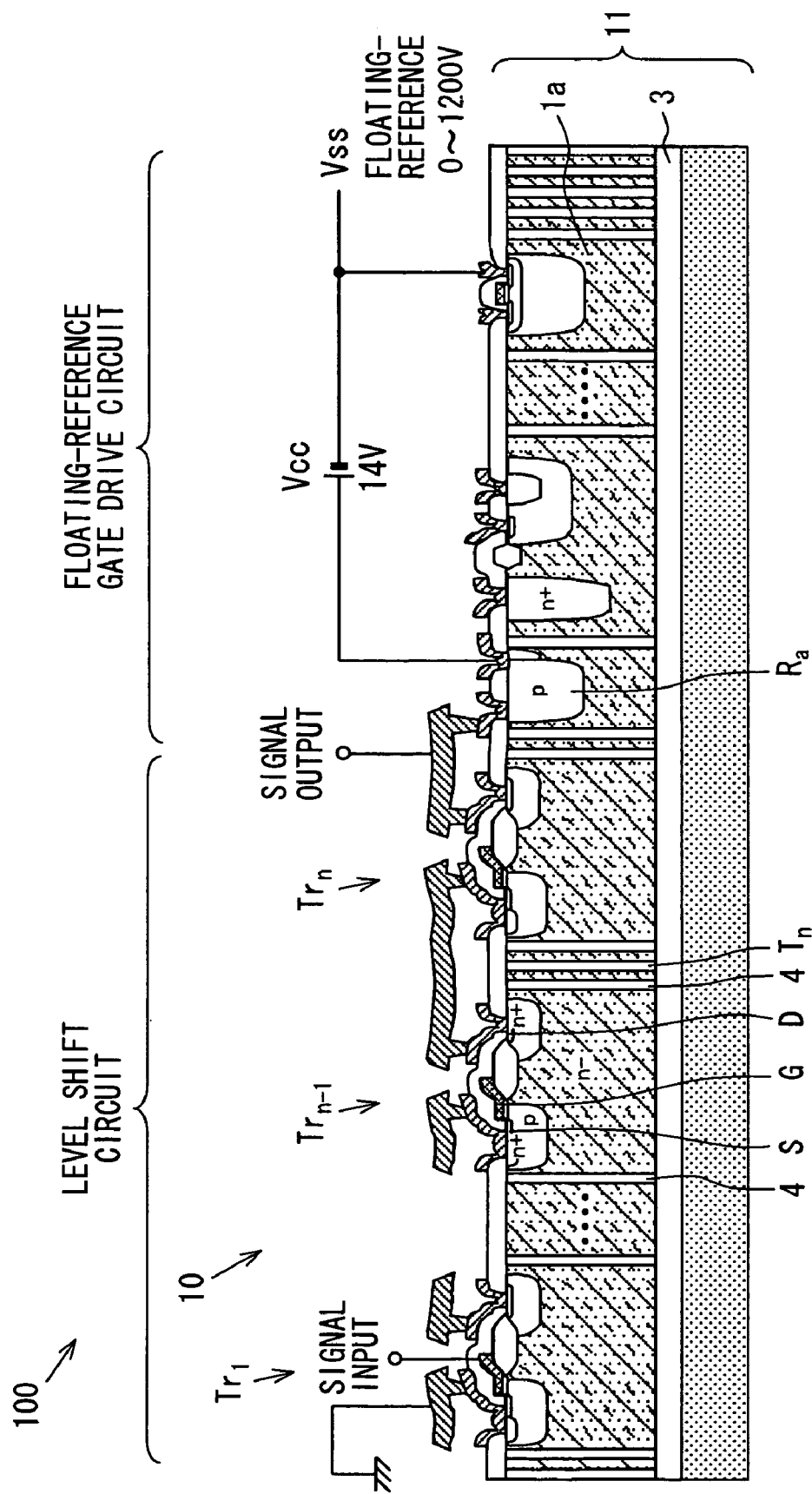
FIG. 34 is a cross sectional view showing the device taken along line XXXIV-XXXIV in FIG. 33.

Incidentally, the internal structure of the semiconductor device 12 shown in FIG. 1 is similar to that of the semiconductor device 10 shown in FIG. 34. More specifically, an SOI substrate which is similar to the SOI substrate 1 shown in FIG. 34 and which includes the buried oxide film and is formed by the sticking of the substrates is employed in the semiconductor device 12 shown in FIG. 1. Besides, the first insulating separation trenches Z1 of the semiconductor device 12 shown in FIG. 1 correspond to the insulating separation trenches 4 of the semiconductor device 10 shown in FIG. 34, and the second insulating separation trenches Z2 of the semiconductor device 12 shown in FIG. 1 correspond to the insulating separation trenches $T_1$-$T_n$ of the semiconductor device 10 shown in FIG. 34.

Besides, as in the semiconductor device 11 shown in FIG. 35, in the semiconductor device 12 shown in FIG. 1, the six LDMOSs 11t are successively connected in series between a ground (GND) potential and a predetermined power source potential, with a first stage of GND potential side being the outer peripheral side of the sextuple second insulating separation trenches Z2 and with a sixth stage of power source potential side being the inner peripheral side thereof. Incidentally, sign $R_{in}$ denotes an input resistor, and sign $R_{out}$ denotes an output resistor. In the semiconductor device 12, a gate terminal in the first-stage LDMOS 11t is used as an input terminal. Besides, the output resistor $R_{out}$ is connected between the sixth-stage LDMOS 11t and the power source pad, and an output is derived from between the terminal of the sixth-stage LDMOS 11t on the power source potential side thereof and the output resistor $R_{out}$. In the semiconductor device 12, combinations each of which consists of a resistance element R and a capacitance element C that are connected in parallel are connected in series in multiple stages, thereby to divide the voltage between the GND potential and the power source potential, and the gates of the LDMOSs 11t of the second stage and the like are respectively connected to the branch points of the series connection.

In the semiconductor device 12 shown in FIG. 1, the voltage between the GND potential and the power source potential is divided by the six LDMOSs 11t, and the respective LDMOSs 11t of the first to sixth stages bear corresponding voltage ranges. Accordingly, a DC breakdown voltage required of each of the LDMOSs 11t can be lowered as compared with a DC breakdown voltage in the case where the voltage between the GND potential and the power source potential is borne by a single transistor element.

By the way, in the semiconductor device 12 shown in FIG. 1, the six LDMOSs 11t should preferably have the same breakdown voltages. Thus, the voltages (breakdown voltages) which the respective LDMOSs 11t inserted between the GND potential and the power source potential bear can be equalized and minimized.

The above points are the parts at which the semiconductor device 12 shown in FIG. 1 is the same as the semiconductor device 11 shown in FIG. 35.

On the other hand, the semiconductor device 12 shown in FIG. 1 differs from the semiconductor device 11 shown in FIG. 35, in the following point: In the semiconductor device 11 shown in FIG. 35, the potentials of the respective field regions F1-F6 surrounded with the second insulating separation trenches Z2 are not fixed, but they are floating potentials. In contrast, in the semiconductor device 12 shown in FIG. 1, the field region F6 surrounded with the second insulating separation trench Z2 at the sixth stage being the innermost periphery is connected to the line of the power source pad, and the potential of the field region F6 is fixed at the power source potential.

Figure 36:
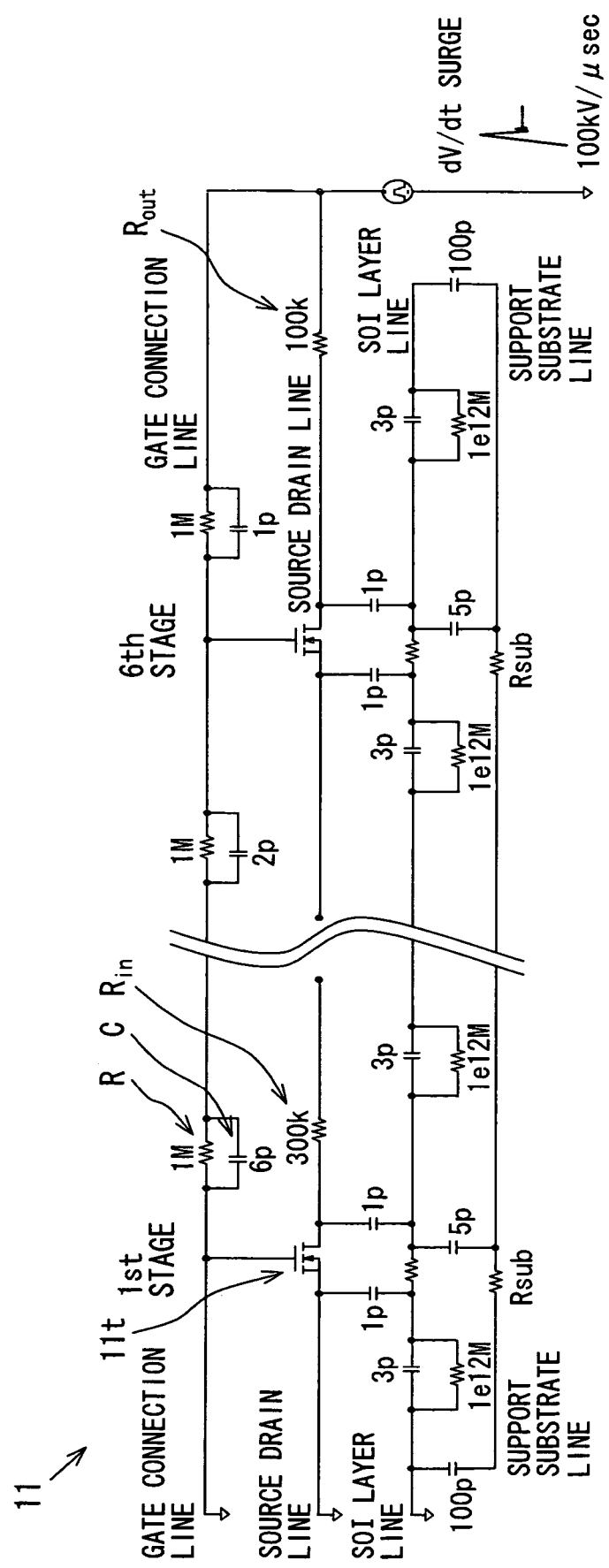
FIG. 36 is a circuit diagram showing the device in FIG. 35, which is used for simulation.

As shown in an equivalent circuit in FIG. 2, in the simulation of the semiconductor device 12 at the application of a dV/dt surge, the equivalent circuit is constituted by gate connection lines each consisting of the resistance element R and the capacitance element C, the source-drain lines of the LDMOSs 11t, SOI layer lines and support substrate lines, in consideration of parasitic capacitances, etc. developing in the SOI substrate, likewise to the equivalent circuit of the simulation of the semiconductor device 11 shown in FIG. 36. On the other hand, in the equivalent circuit of the semiconductor device 12 in FIG. 2, unlike in the equivalent circuit of the semiconductor device 11 shown in FIG. 36, the SOI layer line is connected with the line of the power source pad on the power source potential side of the sixth-stage LDMOS 11t, in correspondence with the point that the potential of the field region F6 surrounded with the second insulating separation trench Z2 at the sixth stage being the innermost periphery is fixed at the power source potential.

FIG. 3 shows the simulation results of the semiconductor device 12 in the case where the dV/dt surge of 100 kV/μsec entered. In FIG. 3, there are shown the change-with-time graphs of potentials at the output pad, the drains Ds of the LDMOSs 11t of the respective stages, and the power source side of the input resistor $R_{in}$. The change-with-time of the output pad potential is the same as the change-with-time of the input dV/dt surge. Incidentally, as described with reference to FIG. 37, the drains Ds of the fifth and sixth stages have an identical potential in FIG. 3, and no voltage is applied across the LDMOS 11t of the sixth stage. This is ascribable to the circuit arrangement shown in FIG. 2, and is not an essential problem.

Figure 37:
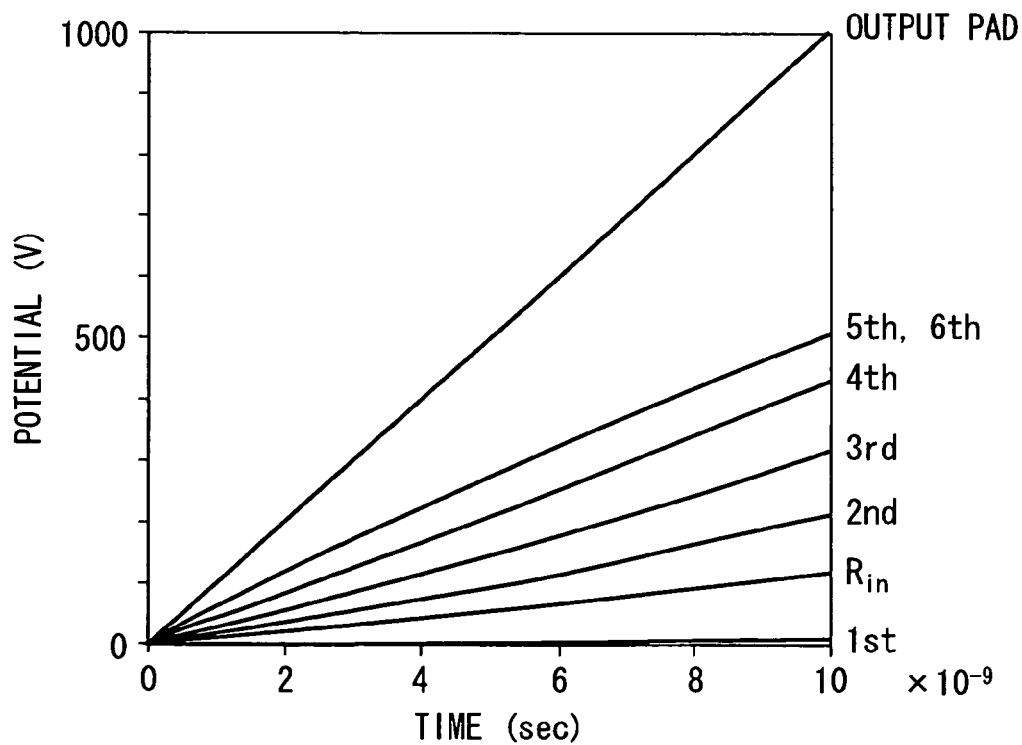
FIG. 37 is a graph showing a relation ship between a potential at each stage in the device and elapsed time in a simulation result of the device in FIG. 35.
Figure 31:
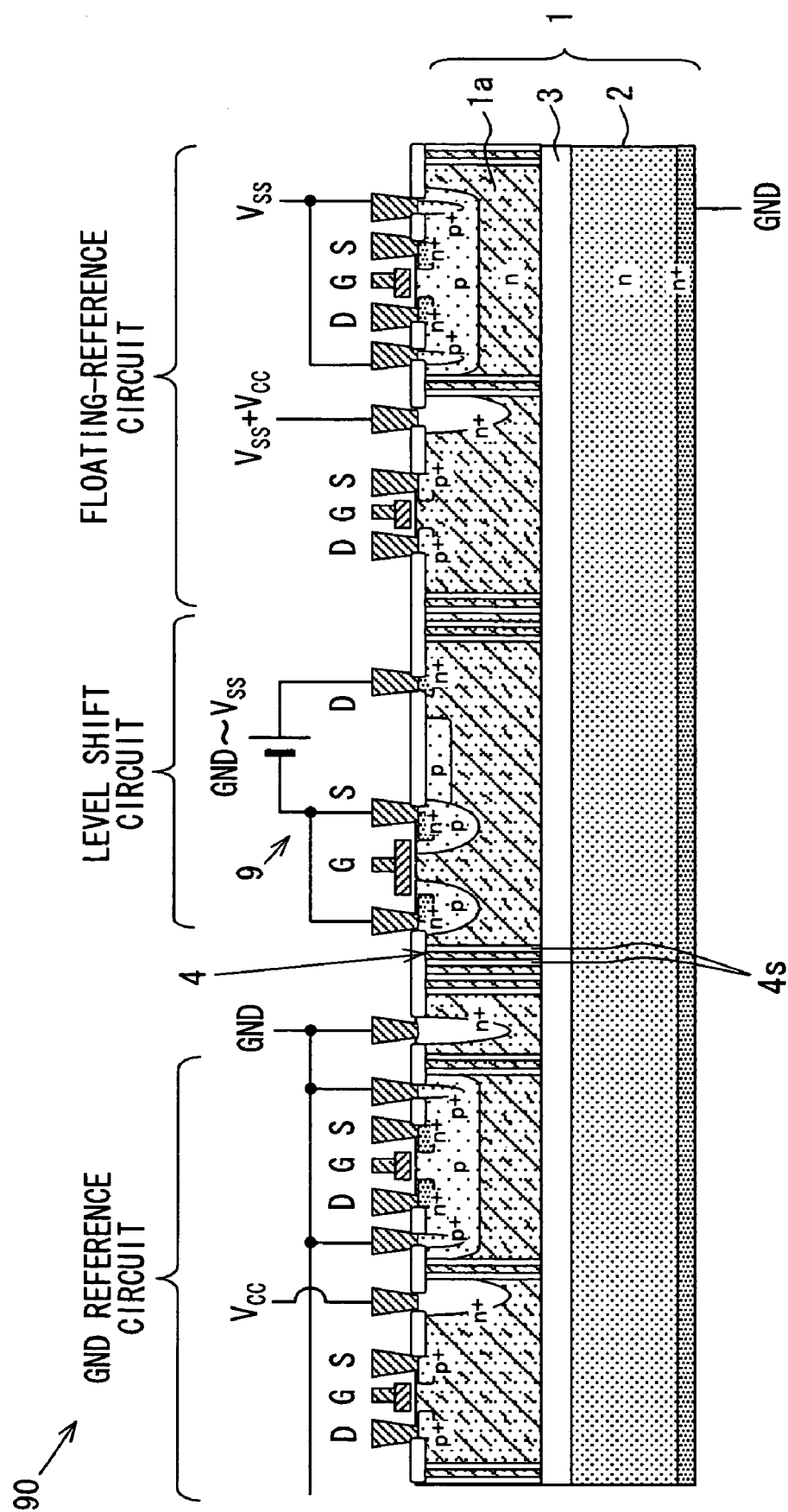
FIG. 31 is a cross sectional view showing a semiconductor device having a SOI substrate and a trench separation structure according to a prior art.
Figure 32:
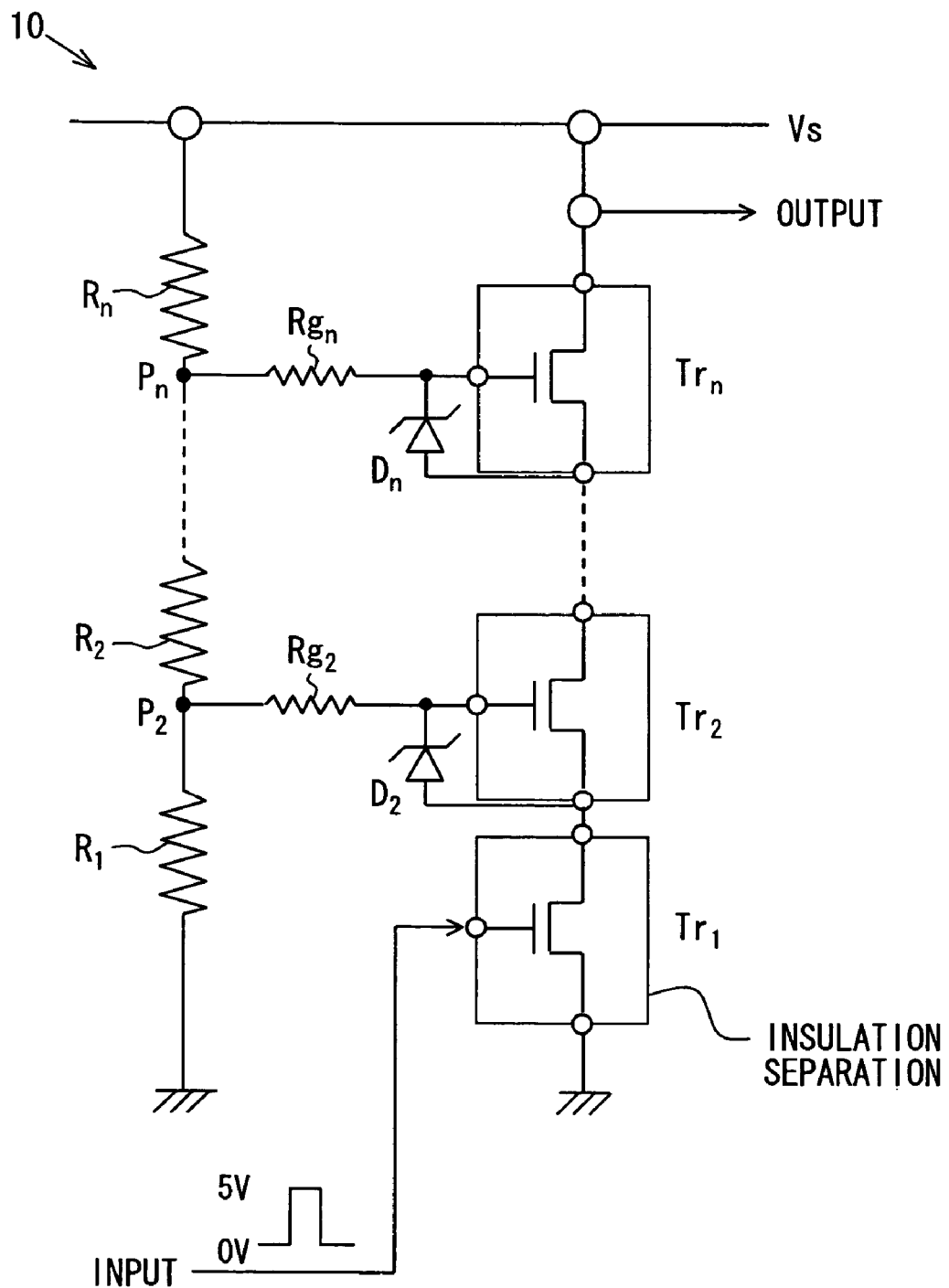
FIG. 32 is a circuit diagram showing a semiconductor device according to a related art.

As indicated in FIG. 3, the potential of the field region F6 surrounded with the second insulating separation trench Z2 at the innermost periphery is fixed at the power source potential in the semiconductor device 12. For this reason, a potential difference which develops between the output pad and the drain D of the sixth-stage LDMOS 11t becomes smaller than in the simulation results of the semiconductor device 11 shown in FIG. 37. That is, in the case where the dV/dt surge has entered from the output side as shown in FIG. 37, the application of a larger dV/dt surge voltage with an inclination to the output resistor $R_{out}$ can be suppressed in comparison with dV/dt surge voltages which are applied to the LDMOSs 11t of the respective stages. In this manner, the voltage ascribable to the dv/dt surge as is applied to the output resistor $R_{out}$ is suppressed, so that the breakdown of the output resistor $R_{out}$ can be prevented in the semiconductor device 12.

In the above way, the semiconductor device 12 shown in FIG. 1 can be made a semiconductor device which can ensure any required DC breakdown voltage, and which suppresses the inclination of the potential attributed the dV/dt surge generated on the output side and does not lead to circuit breakdown even in the case of the entry of the surge.

By the way, in the semiconductor device 12 shown in FIG. 1, only the field region F6 surrounded with the second insulating separation trench Z2 at the innermost periphery has been fixed at the power source potential. In the semiconductor device 12 shown in FIG. 1, however, the potential of the field region F1 surrounded with the second insulating separation trench Z2 at the outermost periphery should preferably be fixed at the GND potential. Thus, in the case where the dV/dt surge has entered from the output side, the dV/dt surge voltages to be applied to the LDMOSs 11t of the respective stages, and the dV/dt surge voltage to be applied to the output resistor $R_{out}$ can be equalized still further.

Besides, although the second insulating separation trenches Z2 have been formed in sextuple fashion in the semiconductor device 12 shown in FIG. 1, the semiconductor device of the invention is not restricted to the sextuple fashion, but the second insulating separation trenches Z2 may well be formed in any desired n-ply (n≧2) fashion. Further, although the LDMOSs 11t have been respectively arranged in the corresponding field regions F1-F6 one by one in the semiconductor device 12 shown in FIG. 1, the semiconductor device is not restricted to the LDMOSs, but any desired MOS transistors may well be respectively arranged in corresponding field regions one by one.

Next, in order to further improve the characteristics of the semiconductor device 12 as shown in FIG. 3, let's consider a cause for the appearance of the inclination of potential differences in the case where the dV/dt surge entered.

The dV/dt surge causes currents to flow into the support substrate 2 underlying the buried oxide film 3 in FIG. 34, through the parasitic capacitances shown in FIG. 2, whereby currents to pass through the gate connection lines decrease. In an actual device, the sizes of the MOS transistors 11t, the series resistance elements R (and capacitance elements C) between the gates, etc. become large, and the parasitic capacitances to the support substrate 2 become unneglibible, so that the dV/dt surge fails to be blocked as the surge becomes abrupt. When the impurity concentration of the SOI layer 1a formed on the buried oxide film 3 in FIG. 34 is heightened, the influence of the dv/dt surge can be lessened to some extent, but this measure is not satisfactory in the case of the abrupt surge. As a result, the potential of the support substrate fluctuates, and the potentials of the fields where the respective MOS transistors are arranged are not determined by only voltage divisions based on the resistance elements R (and the capacitance elements C) between the gates. This is considered to form the cause of the inclination.

In this manner, in the case where the dV/dt surge entered, the cause of the appearance of the inclination of the potential concerning the MOS transistors 11t of the respective stages consists mainly in the surge currents which flow onto the side of the support substrate 2 through the buried oxide film 3. On account of the surge currents, the potential is nonuniformly transferred from the side of the support substrate 2 to the respective field regions F1-F6 through the buried oxide film 3 again, and the inclination of the potential concerning the MOS transistors 11t of the respective stages appears.

FIGS. 4A-4D show different embodiments of semiconductor devices can prevent the flows of the currents into the support substrate due to the dV/dt surge, and they are views showing the schematic sections of the semiconductor devices 13-16, respectively. By the way, in the semiconductor devices 13-16 in FIGS. 4A-4D, portions similar to those of the semiconductor device 10 shown in FIG. 34 and the semiconductor device 12 shown in FIG. 1 are assigned the same numerals and signs. Besides, in FIGS. 4A-4D, the LDMOSs 11t, etc. arranged in the respective field regions F1-Fn are omitted from illustration for the sake of brevity.

Figure 4A:
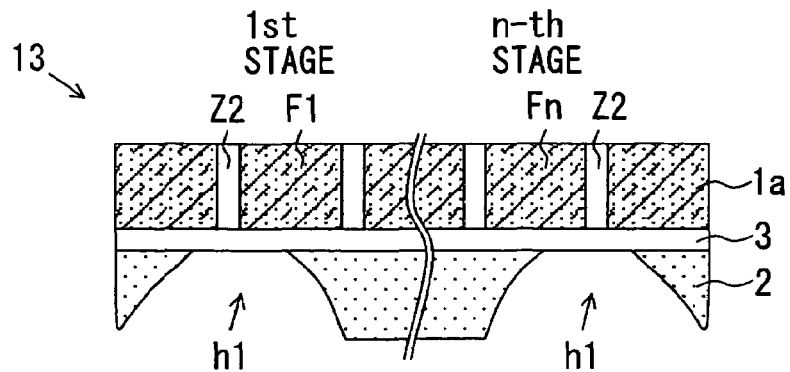
FIGS. 4A to 4D are cross sectional views showing other semiconductor devices.

In the semiconductor device 13 shown in FIG. 4A, hollows h1 which reach the buried oxide film 3 are formed in that support substrate 2 of the SOI substrate which lies on the side opposite to the SOI layers 1a with the buried oxide film 3 interposed therebetween. The individual field regions F1-Fn formed of n SOI layers 1a are respectively surrounded with the hollows h1 within the plane of the SOI substrate.

Thus, it is possible to prevent the flows of the surge currents into the support substrate 2 as are considered the main cause of the inclination of the potential. Accordingly, the MOS transistors, which are formed in the respective field regions F1-Fn, become less susceptible to the influence of the potential of the support substrate 2, and the inclination of the potential is lessened, so that a breakdown voltage against the surge is improved.

Figure 4B:
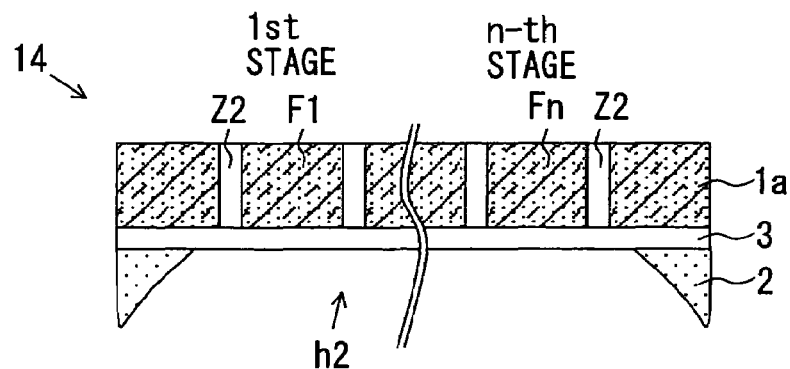

In the semiconductor device 14 shown in FIG. 4B, a hollow h2 which reaches the buried oxide film 3 is formed in the support substrate 2, and the individual field regions F1-Fn formed of n SOI layers are covered with the hollow h2 within the plane of the SOI substrate.

In this semiconductor device 14, the respective field regions F1-Fn formed of the n SOI layers are entirely underlaid with the hollow h2. Therefore, the MOS transistors which are formed in the respective field regions F1-Fn are less susceptible to the influence of the potential of the support substrate 2 still further, and the inclination of the potential becomes very little, so that a breakdown voltage against the surge is more improved.

Figure 5A:
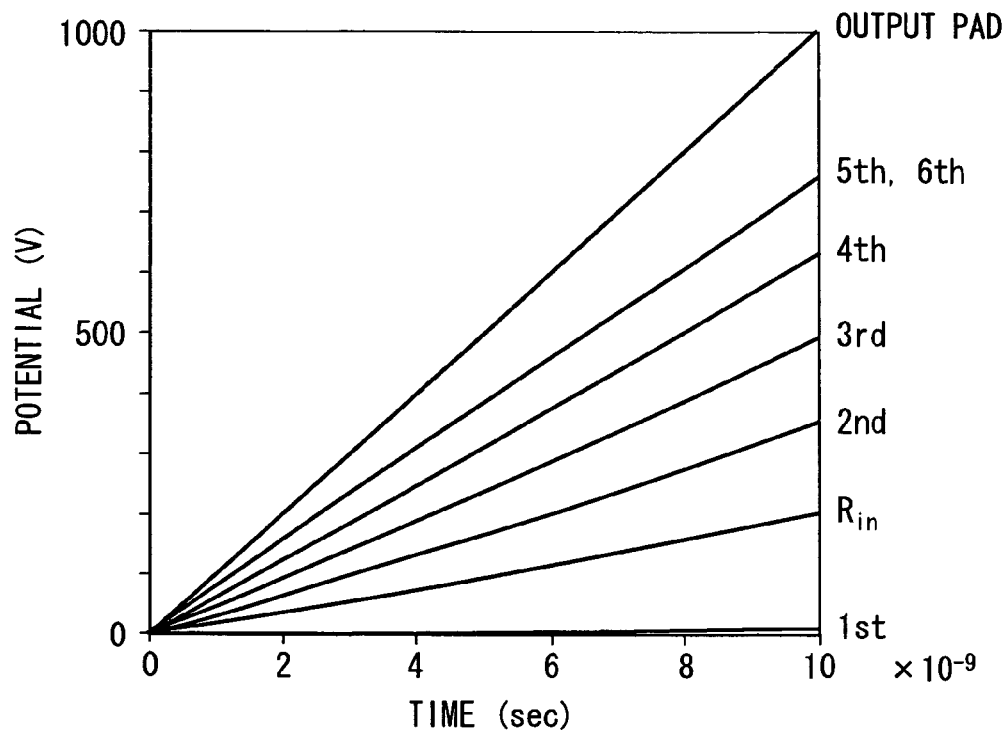
FIG. 5A is a graph showing a relation ship between a potential at each stage in the device and elapsed time in a case where a field region F6 is not fixed and a hollow h2 is disposed under each field region F1-F6.
Figure 5B:
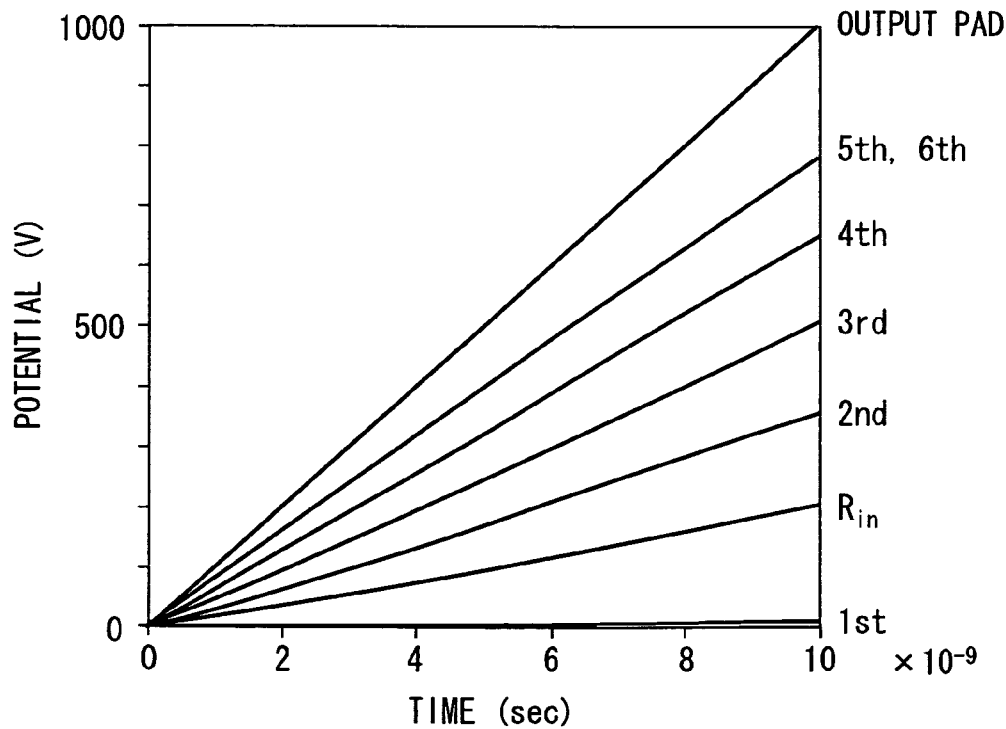
FIG. 5B is a graph showing a relation ship between a potential at each stage in the device and elapsed time in a case where a field region F6 is fixed at a power source potential and a hollow h2 is disposed under each field region F1-F6.

FIGS. 5A and 5B show simulation results in the cases where the individual field regions F1-F6 are underlaid with the cavities (or hollows) h2 as to the semiconductor device 11 shown in FIG. 35 and the semiconductor device 12 shown in FIG. 1, respectively.

FIG. 5A shows the simulation results in the case where the respective field regions F1-F6 are underlaid with the cavity h2, and where the potential of the field region F6 is not fixed. Here, the inclination of the potential attributed to the dV/dt surge generated on the output side is much more suppressed as compared with the inclination of the potential in the simulation results of the semiconductor device 11 as shown in FIG. 37.

FIG. 5B shows the simulation results in the case where the respective field regions F1-F6 are underlaid with the cavity h2, and where the field region F6 is fixed at the power source potential. Here, the inclination of the potential attributed to the dV/dt surge generated on the output side is much more suppressed as compared with the inclination of the potential in the simulation results of the semiconductor device 12 as shown in FIG. 3, and it is more suppressed as compared with the inclination of the potential in the simulation results in FIG. 5A in the case where the potential of the field region F6 is not fixed.

By the way, in the respective semiconductor devices 13 and 14 in FIGS. 4A and 4B, the hollows h1 and h2 can be worked by, for example, etching operations from the rear surfaces of these devices. Besides, since each of the hollows h1 of the semiconductor device 13 in FIG. 4A is smaller than the hollow h2 of the semiconductor device 14 in FIG. 4B, the semiconductor device 13 in FIG. 4A is superior in strength to the semiconductor device 14 in FIG. 4B.

Figure 4C:
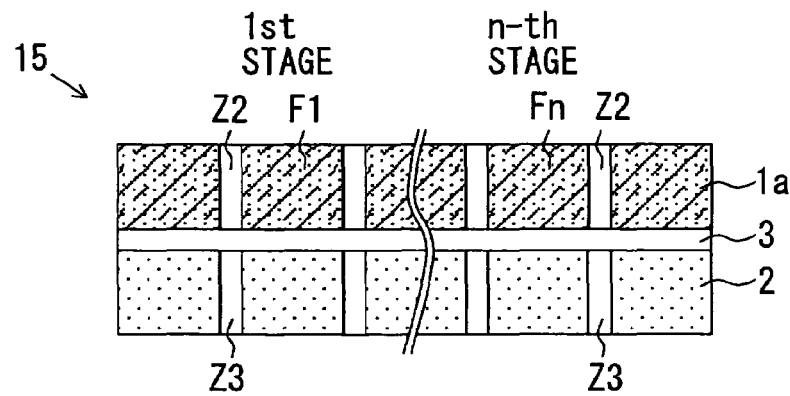

On the other hand, in the semiconductor device 15 shown in FIG. 4C, third insulating separation trenches Z3 which reach the buried oxide film 3 are formed in that support substrate 2 of the SOI substrate which lies on the side opposite to SOI layers 1a with the buried oxide film 3 interposed therebetween, and the individual field regions F1-Fn formed of the n SOI layers 1a are surrounded with the third insulating separation trenches Z3 within the plane of the SOI substrate.

Also in the semiconductor device 15 shown in FIG. 4C, accordingly, it is possible to prevent the flows of the surge currents into the support substrate 2 as form the main cause of the inclination of the potential. For this reason, the MOS transistors, which are formed in the respective field regions F1-Fn, become less susceptible to the influence of the potential of the support substrate 2, and the inclination of the potential is lessened, so that a breakdown voltage against the surge is improved.

Further, in the semiconductor device 15, the third insulating separation trenches Z3 are formed in the same pattern as that of the second insulating separation trenches Z2, and these third insulating separation trenches Z3 are arranged directly under the second insulating separation trenches Z2 within the plane of the SOI substrate.

In this case, also on the side of the support substrate 2, the insulating separation regions are formed in the pattern similar to that of the respective field regions F1-Fn formed of the n SOI layers 1a. Therefore, the MOS transistors which are formed in the respective field regions F1-Fn are less susceptible to the influence of the potential of the support substrate 2 still further, and the inclination of the potential becomes less, so that a breakdown voltage against the surge is more improved.

In the respective semiconductor devices 13-15 shown in FIGS. 4A-4C, the SOI substrates each including the buried oxide film 3 are employed. In contrast, in the semiconductor device 16 shown in FIG. 4D, an SOI substrate including an insulating substrate 2a is employed. The material of the insulating substrate 2a may be any desired insulator such as silicon oxide ($SiO_2$) or glass.

Figure 4D:
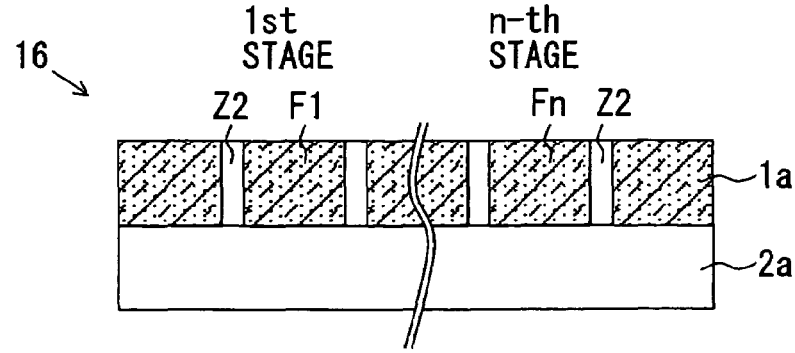

In the semiconductor device 16 in FIG. 4D, the flows of the surge currents into the insulating substrate 2a as form the main cause of the inclination of the potential do not occur. Accordingly, the MOS transistors, which are formed in the respective field regions F1-Fn, do not undergo the influence of the potential of the insulating substrate 2a, and hence, the inclination of the potential becomes very little, so that a breakdown voltage against the surge is improved.

Figure 6:
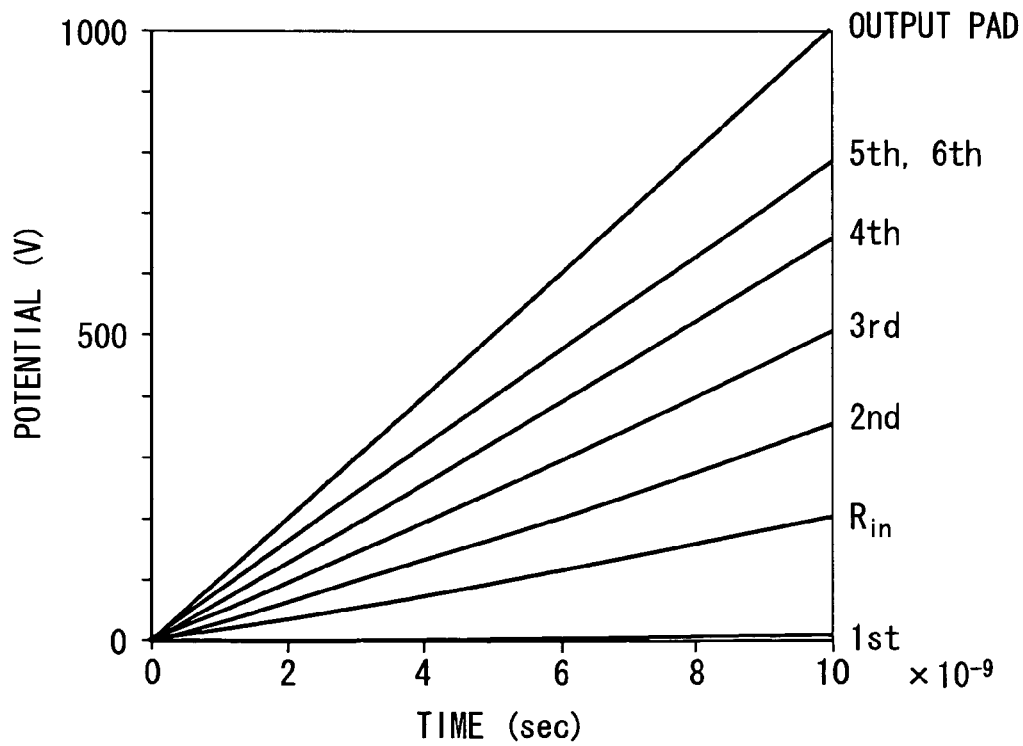
FIG. 6 is a graph showing a relation ship between a potential at each stage in the device and elapsed time in a case where a field region F6 is fixed at a power source potential and a $SiO_2$ insulating substrate 2a is disposed under each field region F1-F6.

FIG. 6 shows simulation results in the case where the SOI substrate including the $SiO_2$ insulating substrate 2a is employed for the semiconductor device 12 shown in FIG. 1.

In the simulation results in FIG. 6, the inclination of the potential attributed to the dV/dt surge generated on the output side is much more suppressed in the same manner as in the simulation results shown in FIG. 5B in the case the respective field regions F1-Fn are underlaid with the cavity h2.

In the above way, also the semiconductor devices 13-16 shown in FIGS. 4A-4D can be made semiconductor devices each of which can ensure any required DC breakdown voltage, and which suppresses the inclination of the potential attributed to the dV/dt surge generated on the output side and does not lead to circuit breakdown even in the case of the entry of the surge.

Figure 7:
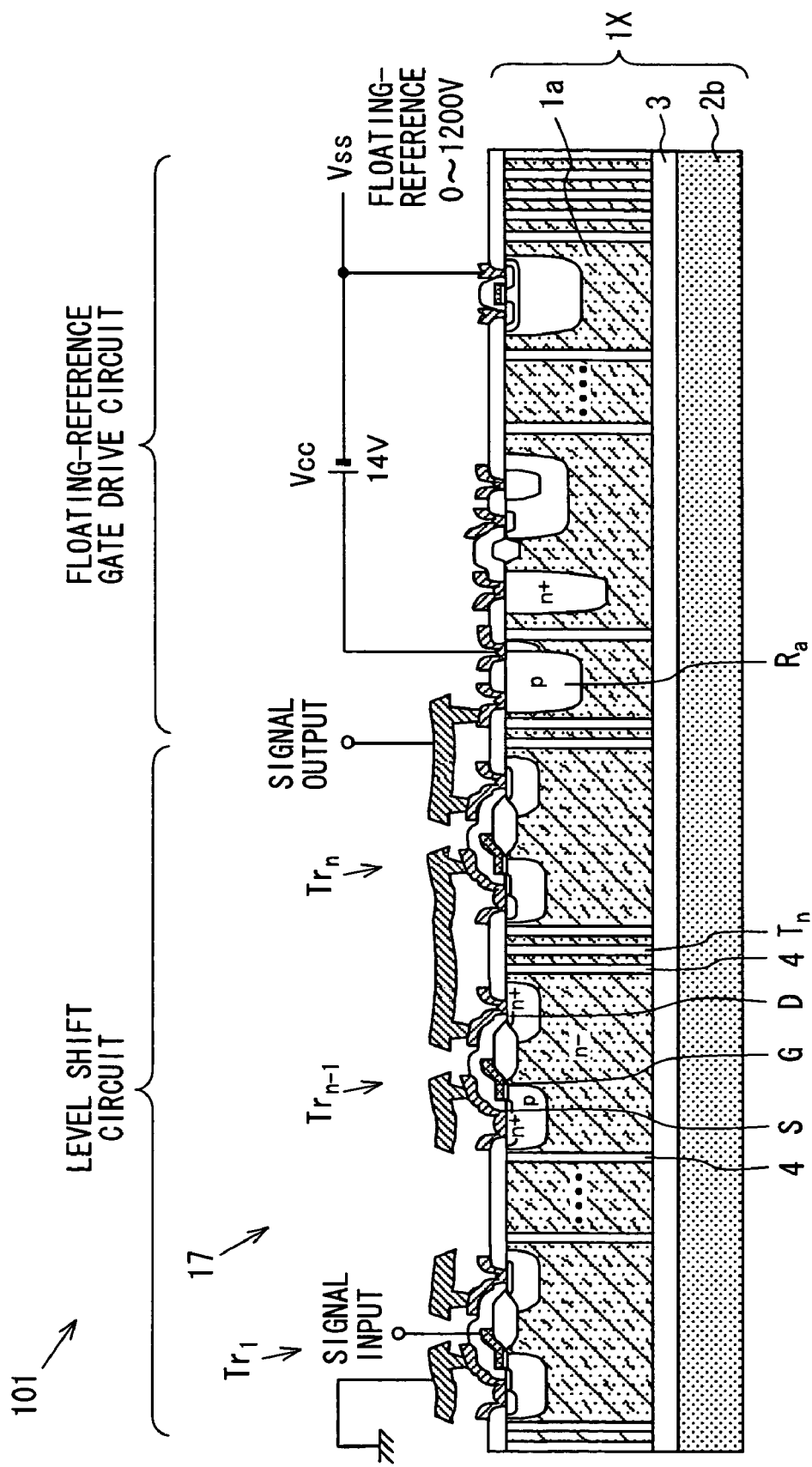
FIG. 7 is a cross sectional view showing another semiconductor device for limiting current flow of dV/dt surge into a substrate.
Figure 33:
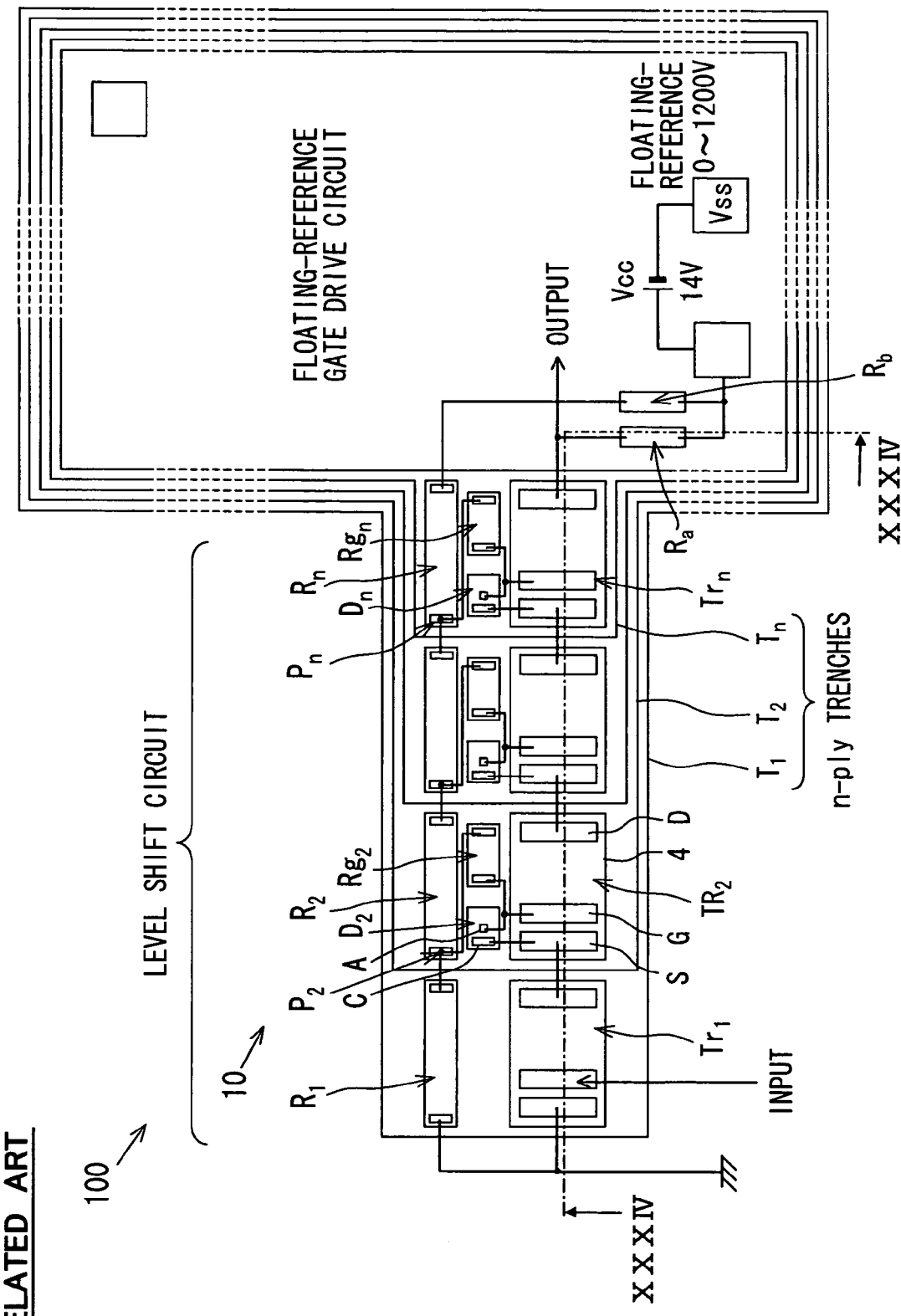
FIG. 33 is a circuit diagram showing a level shift circuit and a floating-reference gate drive circuit in a high voltage IC of the device in FIG. 32.

FIG. 7 shows another embodiment of a semiconductor device which can suppress the flows of currents into a support substrate attributed to a dV/dt surge, and it is a sectional view of a high voltage IC 101 (semiconductor device 17) which has a planar structure similar to that of the high voltage IC 100 (semiconductor device 10) in FIG. 33. By the way, in the high voltage IC 101 (semiconductor device 17) in FIG. 7, portions similar to the individual portions of the section of the high voltage IC 100 (semiconductor device 10) as shown in FIG. 34 are respectively assigned the same numerals and signs.

Whereas the SOI substrate 1 employed in the formation of the semiconductor device 10 in FIG. 33 has included the support substrate 2 made of silicon, an SOI substrate 1X employed for the formation of the semiconductor device 17 in FIG. 7 includes a support substrate 2b made of a resistor material other than the silicon.

In the case where the silicon (Si) of high resistance (low impurity concentration) is employed as the support substrate 2 as in the semiconductor device 10 in FIG. 34, the specific resistance of the material itself is high. However, when the transistor elements $Tr_1$-$Tr_n$ are operated after the formation of the semiconductor device 10, inversion layers are formed in the front surface of the support substrate 2 on account of high potentials applied to the individual portions of the transistor elements $Tr_1$-$Tr_n$, and the resistance of the support substrate 2, in effect, lowers. In this manner, even with the SOI substrate 1 which includes the support substrate 2 made of nondoped silicon, the breakdown voltage against the dV/dt surge cannot be improved in the case of the formation of the inversion layers.

In contrast, the SOI substrate 1X of the semiconductor device 17 in FIG. 7 includes the support substrate 2b made of the resistor material other than the silicon, so that the above inversion layers as in the support substrate 2 made of the silicon in FIG. 34 are not formed. For this reason, although the support substrate 2b employed for the formation of the semiconductor device 17 in FIG. 7 is not of the insulator of the support substrate 2a employed in the semiconductor device 16 in FIG. 4D, it can always ensure a certain resistance and can suppress the flows of the surge currents. Accordingly, respective transistor elements $Tr_1$-$Tr_n$ are less susceptible to the influence of the potential of the support substrate 2b, so that the inclination of a potential lessens to improve a breakdown voltage against the surge.

Next, there will be described the results of those simulations for a dV/dt surge which were formed as to a semiconductor device 18 that has had the same configuration as in FIG. 35 and that has been formed in the SOI substrate 1X including the support substrate 2b made of the resistor material.

Figure 8:
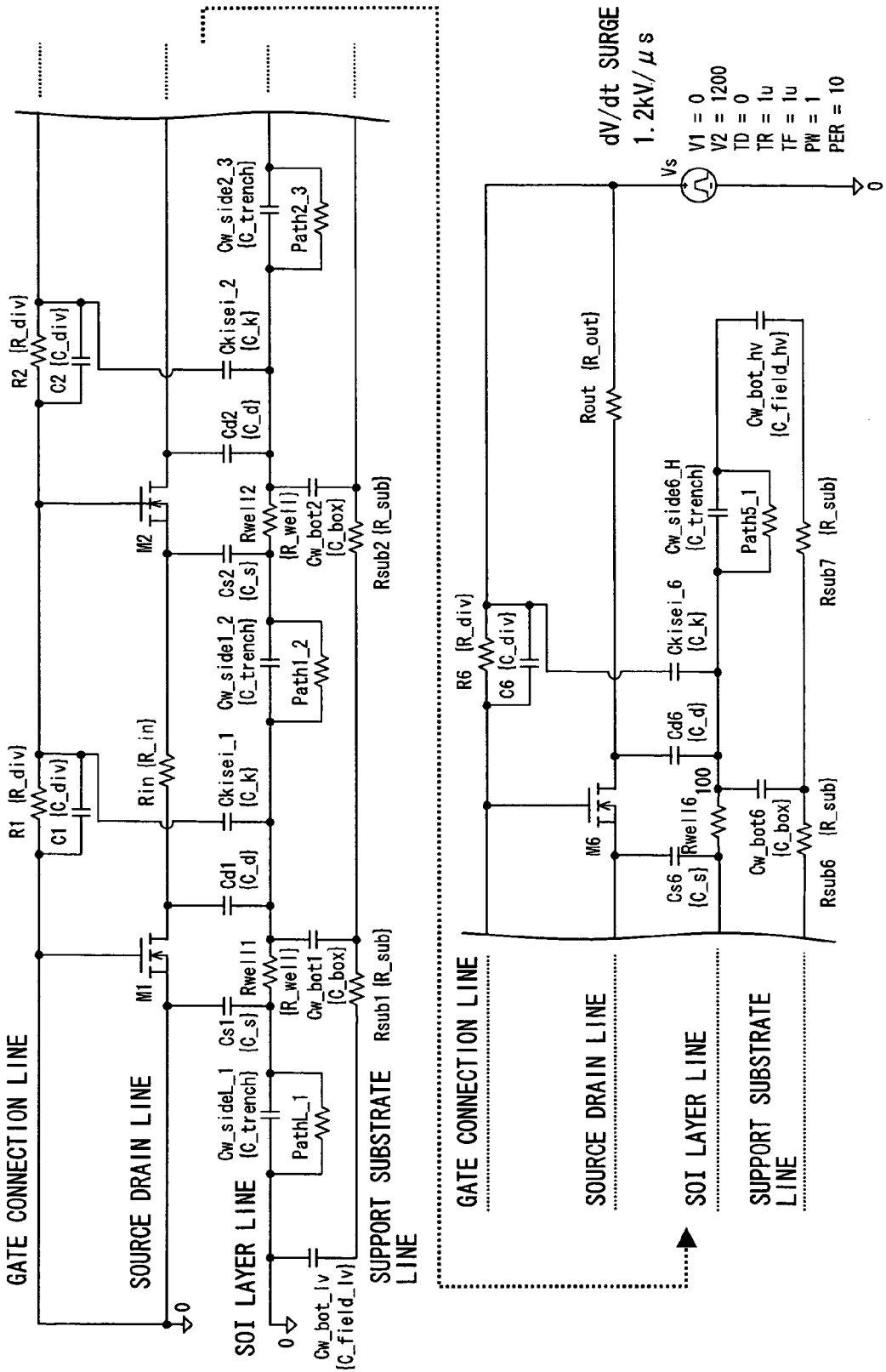
FIG. 8 is a circuit diagram showing a semiconductor device formed on a SOI substrate.

FIG. 8 is an equivalent circuit diagram of the semiconductor device 18 employed in the simulations. FIG. 9 tabulates circuit constants employed in the simulations. In FIG. 9, Cbox represents a capacitance per one stage between a field region of each LDMOS and a substrate. Cd represents a parasitic capacitance between field regions of a drain in LDMOS. Cdiv represents a capacitance of a capacitance element (i.e., a smoothing capacitor). Cfield_hv represents a capacitance between a field region of a high voltage circuit and a substrate. Cfield_lv represents a capacitance between a field region of a low voltage circuit and a substrate. Ck represents a parasitic capacitance between a field region and a capacitance element/resistance element. Cs represents a parasitic capacitance between field regions of a source of LDMOS. Ctrench represents a trench capacitance between neighboring field regions. Rdiv represents a capacitance of a resistance element (i.e., divisional resistor). Rin represents an input resistance. Rout represents an output resistance. Rsub represents an equivalent resistance of a substrate per one stage. For example, when a specific resistance of a substrate ρ is 10Ω·cm, a thickness t of the substrate is 500 μm, a length L of a field region of LDMOS is 200 μm, and a width W of a field region of LDMOS is 1000 μm, the equivalent resistance of the substrate Rsub is 40Ω in a case where a carrier inversion is not considered. Here, Rsub is calculated from Rsub=(ρ/t)×(L/W). Rwell represents an equivalent resistance of a field region per one stage. Besides, FIGS. 10A and 10B, FIGS.

11A and 11B, FIGS. 12A and 12B, and FIGS. 13A and 13B are diagrams showing the simulation results, namely, the changes-with-time of potentials at the individual points of the semiconductor device 18 attributed to a surge input, as to those samples of the semiconductor device 18 in FIG. 8 which have had the same configuration as in FIG. 35 and whose support substrates have had respectively different resistances (Rsub) as indicated in FIG. 9.

The resistance (Rsub) parameter of each support substrate as indicated in FIG. 9 denotes the resistance of the support substrate between two adjacent LDMOSs 11t, and the resistance has been obtained in such a way that the resistance component of the support substrate in the area of each of the field regions F1-F6 of the LDMOSs 11t in FIG. 35 is computed in the connection direction of the LDMOSs. By way of example, when the field region corresponding to the support substrate having a specific resistance of 10Ω·cm and a thickness of 500 μm is 200 μm×1000 μm, the resistance (Rsub) is estimated to be 40Ω. In this regard, in the case where the support substrate is made of the silicon as in the semiconductor device 11 shown in FIG. 35, the front surface of the support substrate underlying the respective field regions F1-F6 is inverted by the power source potential. Therefore, the resistance lowers due to surface carriers, and the substantial resistance of the support substrate becomes, for example, 0.01Ω or below.

Figure 10A:
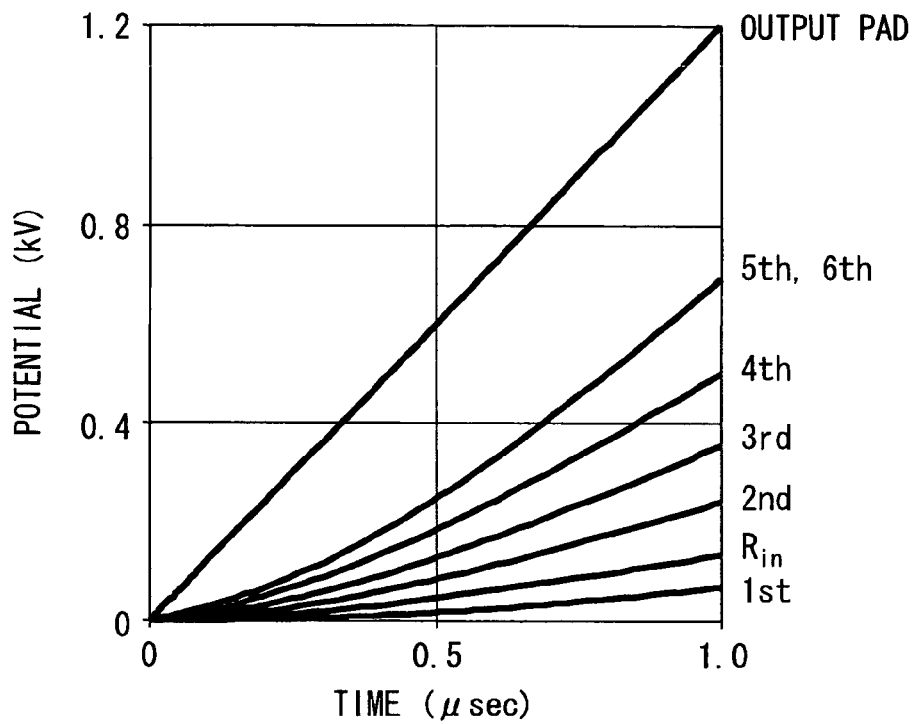
FIG. 10A is a graph showing a relation ship between a potential at each stage in the device and elapsed time in a case where a substrate resistance Rsub is 0.01Ω.
Figure 10B:
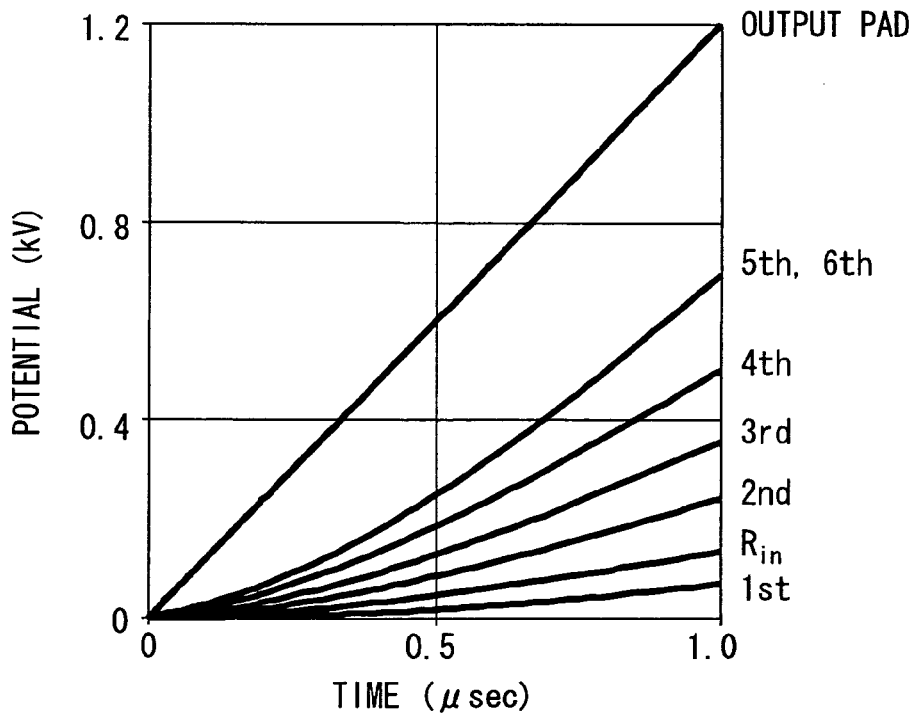
FIG. 10B is a graph showing a relation ship between a potential at each stage in the device and elapsed time in a case where a substrate resistance Rsub is 40Ω.
Figure 11A:
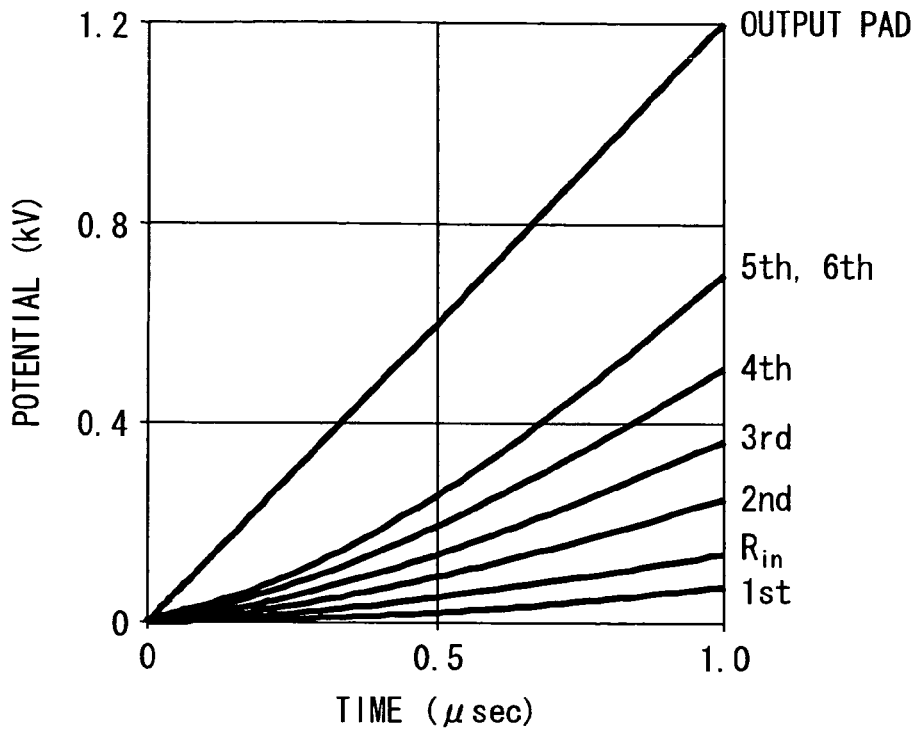
FIG. 11A is a graph showing a relation ship between a potential at each stage in the device and elapsed time in a case where a substrate resistance Rsub is 1 kΩ.
Figure 11B:
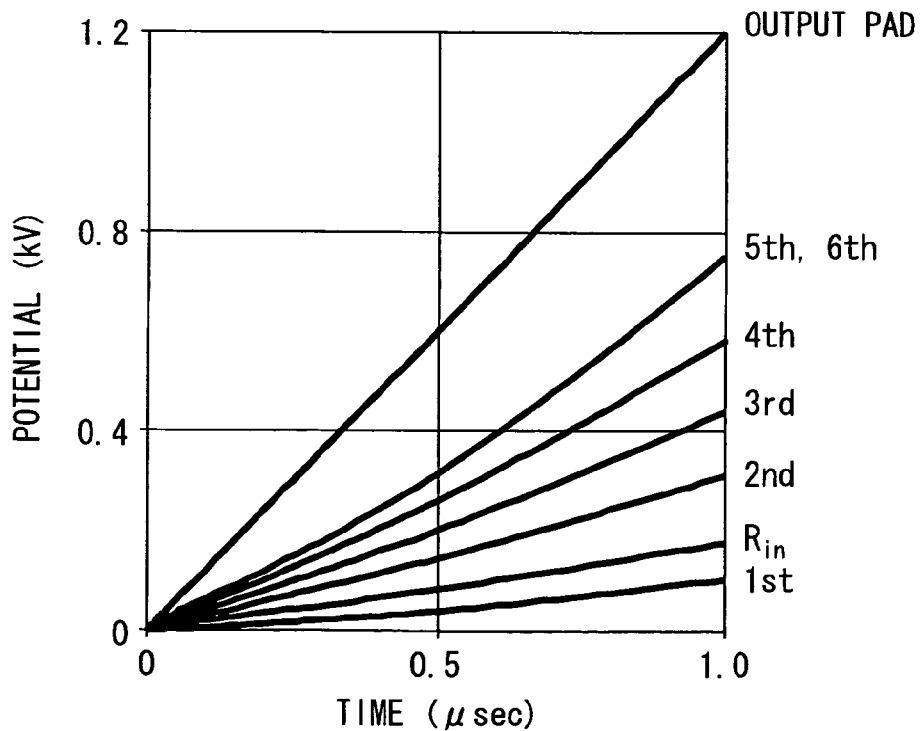
FIG. 11B is a graph showing a relation ship between a potential at each stage in the device and elapsed time in a case where a substrate resistance Rsub is 10 kΩ.
Figure 12A:
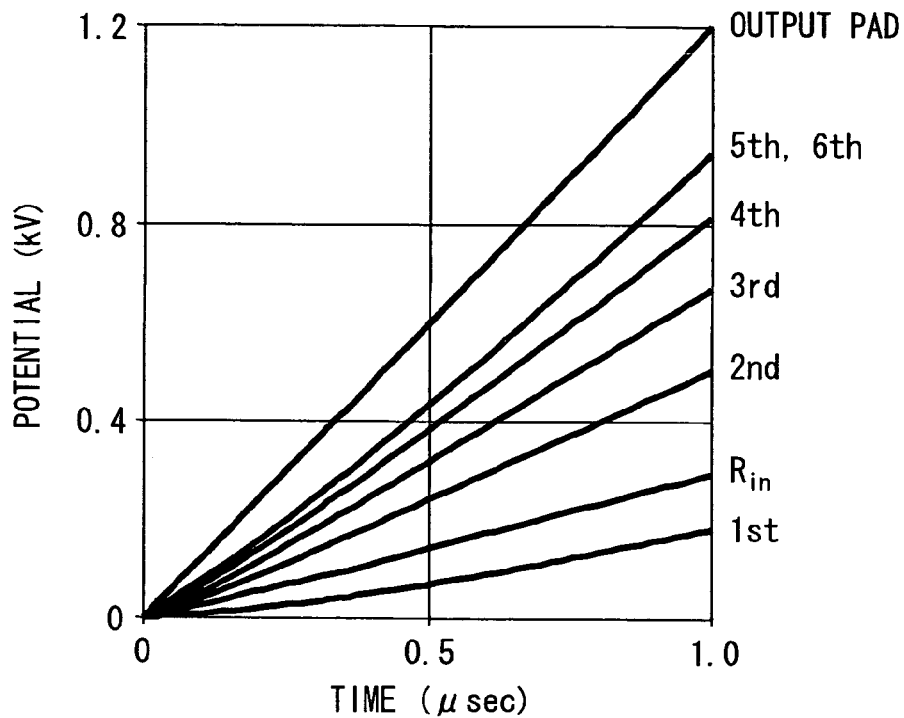
FIG. 12A is a graph showing a relation ship between a potential at each stage in the device and elapsed time in a case where a substrate resistance Rsub is 100 kΩ.
Figure 12B:
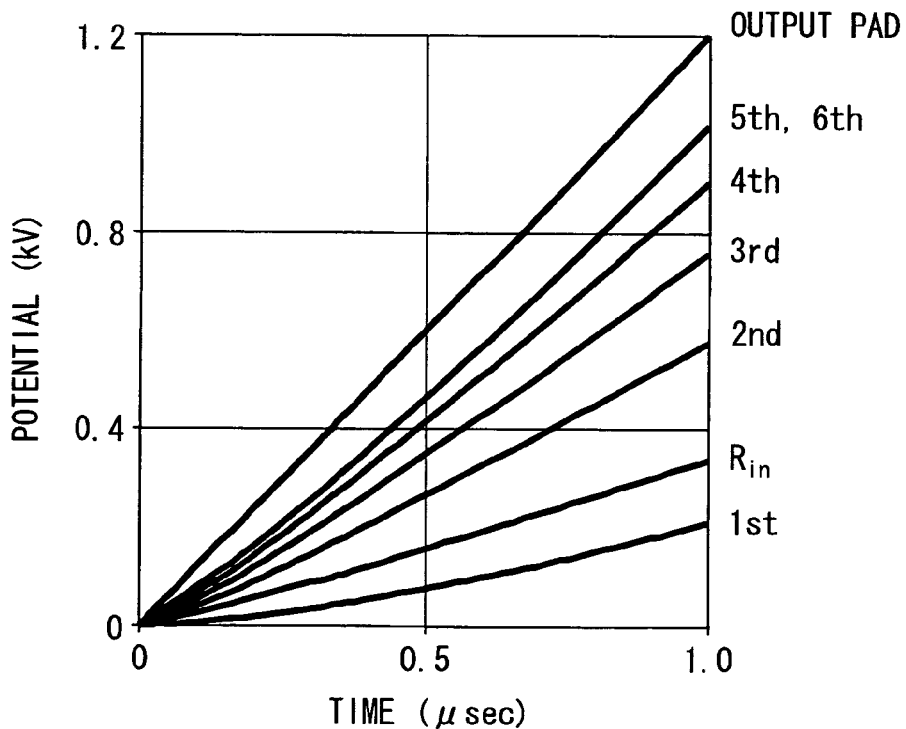
FIG. 12B is a graph showing a relation ship between a potential at each stage in the device and elapsed time in a case where a substrate resistance Rsub is 1 MΩ.
Figure 13A:
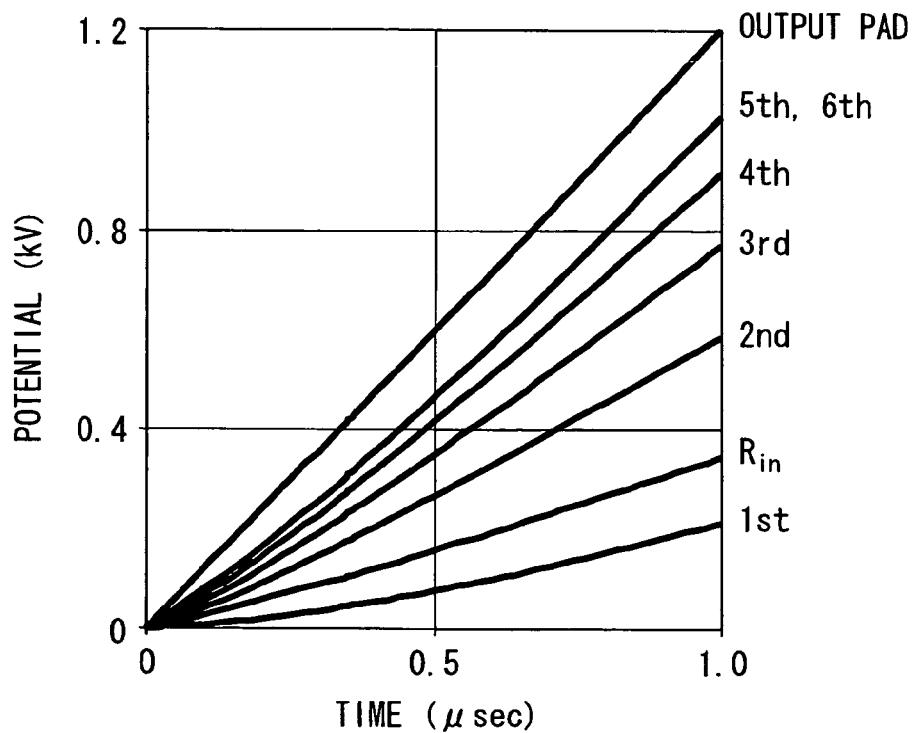
FIG. 13A is a graph showing a relation ship between a potential at each stage in the device and elapsed time in a case where a substrate resistance Rsub is 10 MΩ.
Figure 13B:
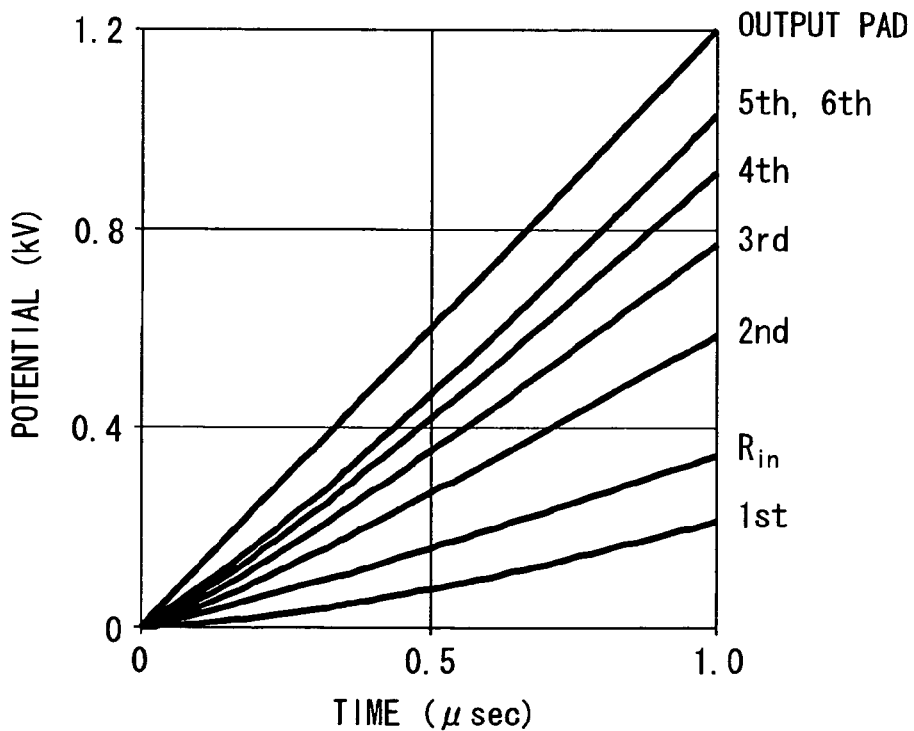
FIG. 13B is a graph showing a relation ship between a potential at each stage in the device and elapsed time in a case where a substrate resistance Rsub is 1 TΩ.

FIG. 10A shows the results of the simulation in which the resistance (Rsub) of the support substrate was set at 0.01Ω. This resistance of the support substrate corresponds to a resistance in the state where the inversion layers have been formed in the front surface due to the operations of the transistor elements, in the support substrate made of the silicon. FIG. 10B shows the results of the simulation in which the resistance (Rsub) of the support substrate was set at 40Ω. This resistance of the support substrate corresponds to a resistance in the case where the specific resistance of the support substrate has been set at 10Ω·cm, where the thickness of the support substrate has been set at 500 μm, and where the ratio (L/W) between the length (L) and width (W) of each field region has been set at 0.2.

As shown in FIGS. 10A and 10B, in the semiconductor device 18 whose support substrate has the resistance Rsub of at most 40Ω, a potential difference of 5/12 of the whole voltage develops across the output resistor $R_{out}$.

FIGS. 11A and 11B, FIGS. 12A and 12B, and FIGS. 13A and 13B show the results of the simulations in which the resistances (Rsub) of the support substrates were respectively set at 1 kΩ, 10 kΩ, 100 kΩ, 1 MΩ, 10 MΩ and 1 TΩ. The resistance of the support substrate in FIG. 13B corresponds to the resistance of the support substrate made of the insulator material.

Figures 14, 16:
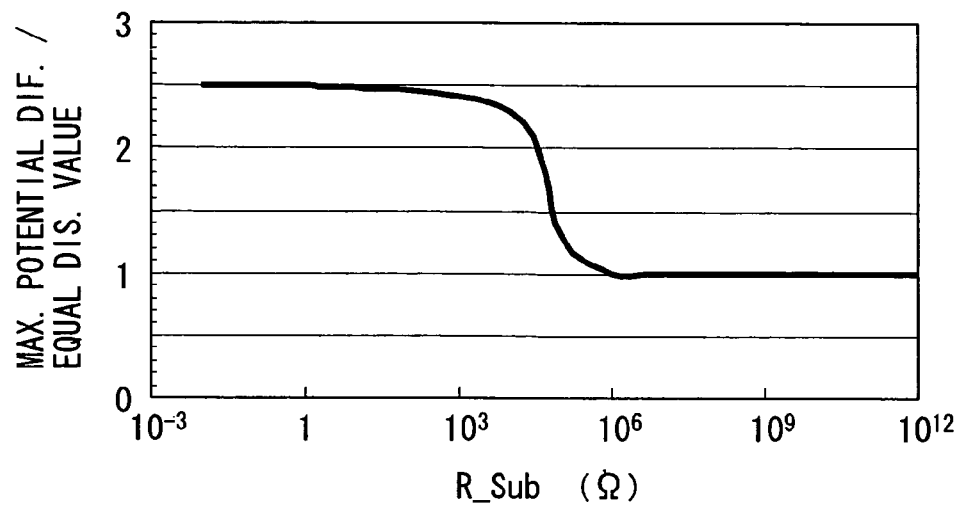
FIG. 14 is a graph showing a relationship between a substrate resistance Rsub and a ratio between a maximum potential difference and an equal distribution value (i.e., 200V)
FIG. 16 is a graph showing circuit constants in various thickness of a buried oxide film in a case where a substrate resistance Rsub is 1Ω, which is a conventional silicon substrate resistance.

FIG. 14 is a diagram in which the simulation results in FIG. 10A-FIG. 13B are put together, and in which the ratios between the maximum potential differences and an equal distribution value (200 V) in the respective figures are taken and graphically shown versus the resistances (Rsub) of the support substrates. As seen from FIG. 14, when the resistance (Rsub) of the support substrate becomes at least 100 kΩ, the distribution of the potentials at the individual points approximates to an equal distribution.

In this manner, the simulation results reveal that the resistance of the support substrate in the semiconductor device 18 in FIG. 14 should preferably be at least 100 kΩ. The specific resistance of the support substrate as calculated from the above dimensional example becomes 25 kΩ·cm. Thus, even when the support substrate is not of a perfect insulator, the potentials at the individual points of the semiconductor device 18 as are ascribable to the surge input can be substantially equalized. Incidentally, the value of the specific resistance differs depending upon the thickness of the support substrate, the dimensions of each of the field regions, the number of the stages of the transistor elements, a dV/dt gradient, and so forth. However, the optimum specific resistance can be estimated for each product by executing similar computations, and the material of the support substrate adapted for the specific resistance may be appropriately selected.

In the above way, also the respective semiconductor devices 17 and 18 shown in FIG. 7 and FIG. 8 can be made semiconductor devices each of which can ensure any required DC breakdown voltage, and which suppresses the inclination of the potential attributed to the dV/dt surge generated on the output side and does not lead to circuit breakdown even in the case of the entry of the surge.

Next, methods of manufacturing the respective semiconductor devices 16 and 17 shown in FIG. 4D and FIG. 7 will be briefly described.

The semiconductor device 16 shown in FIG. 4D has the support substrate 2a made of the insulating material, and employs the SiO$_2$ insulating substrate for the support substrate. Alternatively, an SOS (Silicon On Sapphire) substrate, for example, can be selected as an SOI substrate whose support substrate 2a is made of an insulating material. The SOS substrate is well suited for application to a semiconductor device in which crystal defects and contaminations in an SOI layer are not serious problems, and which does not require a large-diameter wafer.

Besides, each of the respective semiconductor devices 16 and 17 in FIG. 4D and FIG. 7 may well employ an SOI substrate 1 which has been formed by the sticking technique of silicon substrates, SIMOX (Separation by IMplantation of OXygen), or the like, similarly to the semiconductor device 10 shown in FIG. 34. In this case, an internal structure and a wiring layer on the buried oxide film 3 are first formed, and after the removal of the support substrate 2 made of silicon, the different support substrate 2a or 2b made of an insulating material or resistive material is stuck. Incidentally, a processing step such as wiring step, which can be performed at a comparatively low temperature, can also be performed after the different support substrate 2a or 2b has been stuck.

According to the above manufacturing method, plastics (polyethylene, polytetrafluoroethylene or the like), aluminum oxide, or ceramics, for example, can be employed for the different support substrate 2a made of the insulating material. Incidentally, the different support substrate 2a or 2b should desirably have a low coefficient of thermal expansion or a coefficient of thermal expansion close to that of silicon, at and near normal temperatures in relation to the performance of durability.

Regarding the removal of the support substrate 2 made of the silicon, the front surface of the SOI substrate 1 shown in FIG. 34 is coated with a suitable protective material, for example, a TEOS film, and the rear surface side thereof is subsequently subjected to an etching process, thereby to remove the whole support substrate 2. The coating material needs to be prevented from coming off or cracking due to the subsequent etching of the rear surface side, and it requires a strength enough to protect and fix the SOI layer, so that it should desirably have a thickness of at least 100 μm. The etching of the rear surface side may be based on a mechanical grinding process such as CMP (Chemical Mechanical Polishing), or the silicon may well be chemically etched with NaOH, KOH or the like. In either case, the buried oxide film 3 in FIG. 34 is utilized as an etching stopper. If the etching process is appropriate, the in-plane dispersion of the etching can be made about 1 μm within the thickness of the buried oxide film 3. In case of wet etching, an etching solution is adjusted so that the etching ratio thereof to the silicon may become 1: several hundreds.

An adhesive for use in the sticking of the different support substrate 2a or 2b may be a chemical adhesive or the like as long as it endures service environmental temperatures. The adhesive should desirably be thinner, but it may be somewhat thick as long as the parallelism between the buried oxide film 3 and the support substrate 2a or 2b on the rear surface side of the SOI layer (the horizontality of the front surface of substrate after the sticking) can be held. The horizontality of the front substrate surface after the sticking may be to such a degree that an external appearance inspection, the measurements of electrical and mechanical characteristics, chip dicing, etc. can be coped with. Regarding an adhesion strength, the support substrate 2a or 2b needs to be prevented from undergoing coming-off and the like abnormalities due to thermal cycles or fluctuations with time. A silicone-based adhesive, for example, can be used as a material complying with these requirements.

In addition, the insulating material or resistive material can be formed under the buried oxide film 3 by employing epitaxial growth or film deposition, unlike the sticking of the different support substrate 2a or 2b. It is also allowed that a film to be first formed is endowed with a lower-limit thickness (several μm or above) which hinders the dV/dt surge from flowing, followed by the deposition of a film of high deposition rate or the bonding of the substrate.

Figure 15:
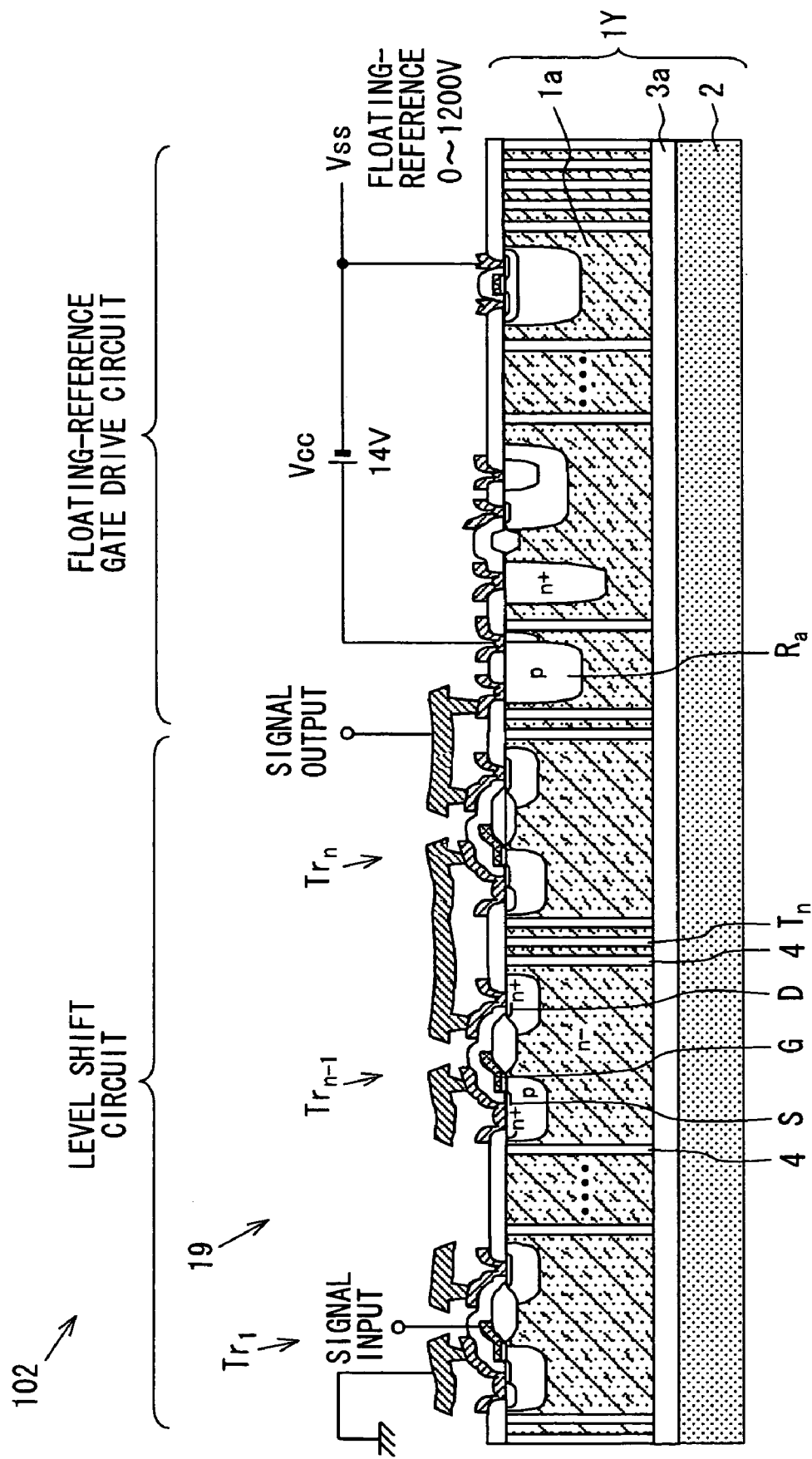
FIG. 15 is a cross sectional view showing another semiconductor device for limiting current flow of dV/dt surge into a substrate.
Figure 17A:
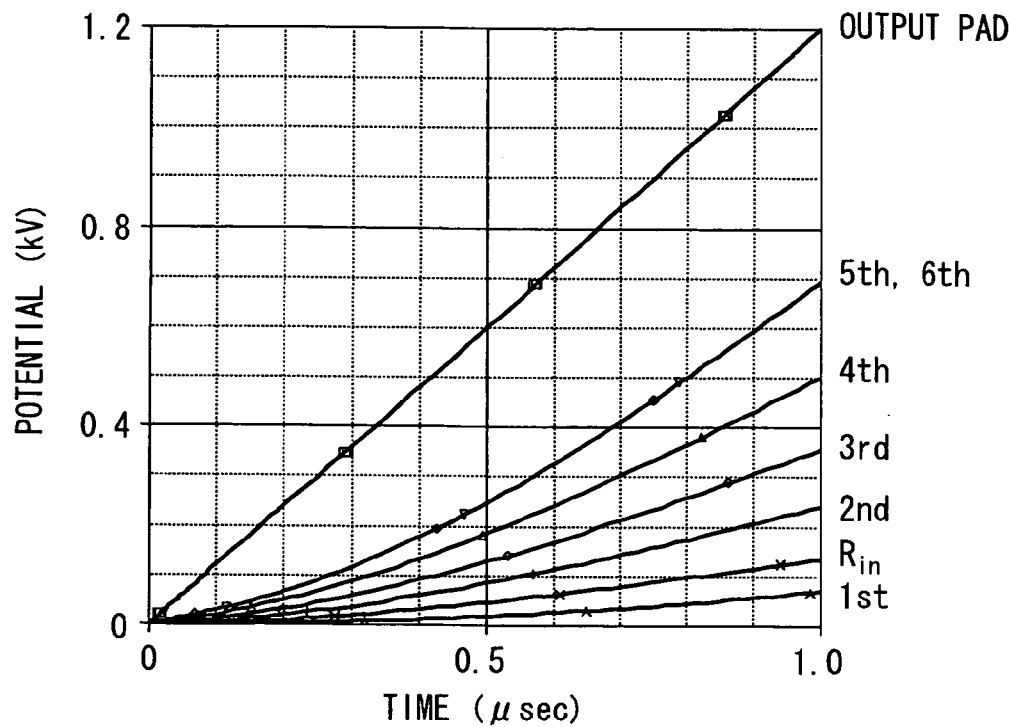
FIG. 17A is a graph showing a relation ship between a potential at each stage in the device and elapsed time in a case where a thickness of a buried oxide film is 3 μm.
Figure 17B:
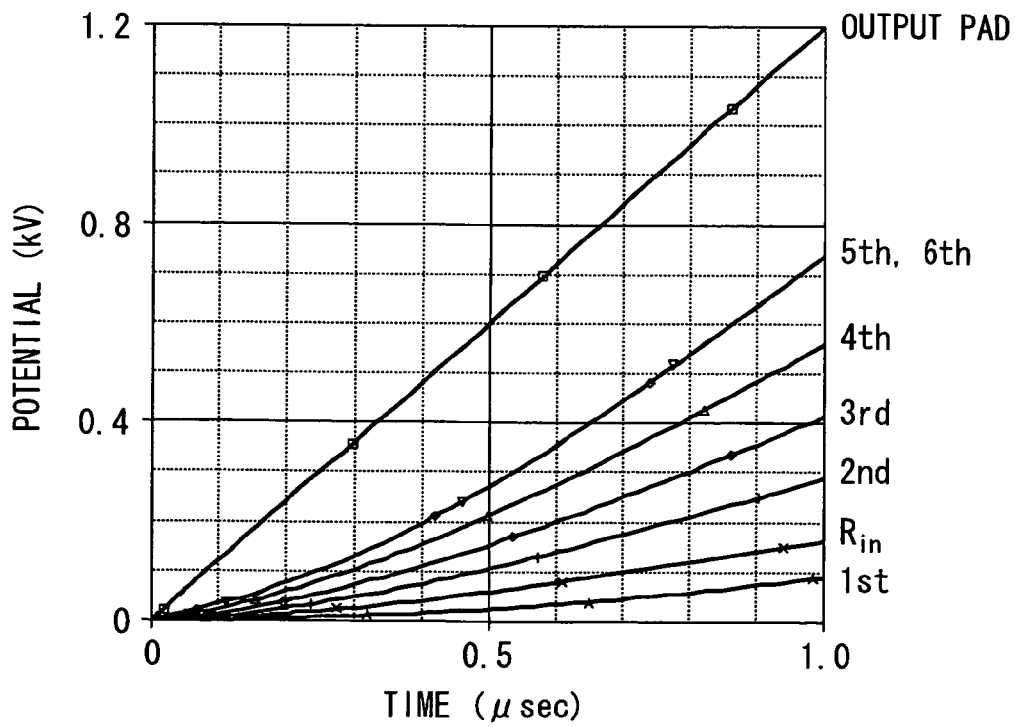
FIG. 17B is a graph showing a relation ship between a potential at each stage in the device and elapsed time in a case where a thickness of a buried oxide film is 5 µm.
Figure 18A:
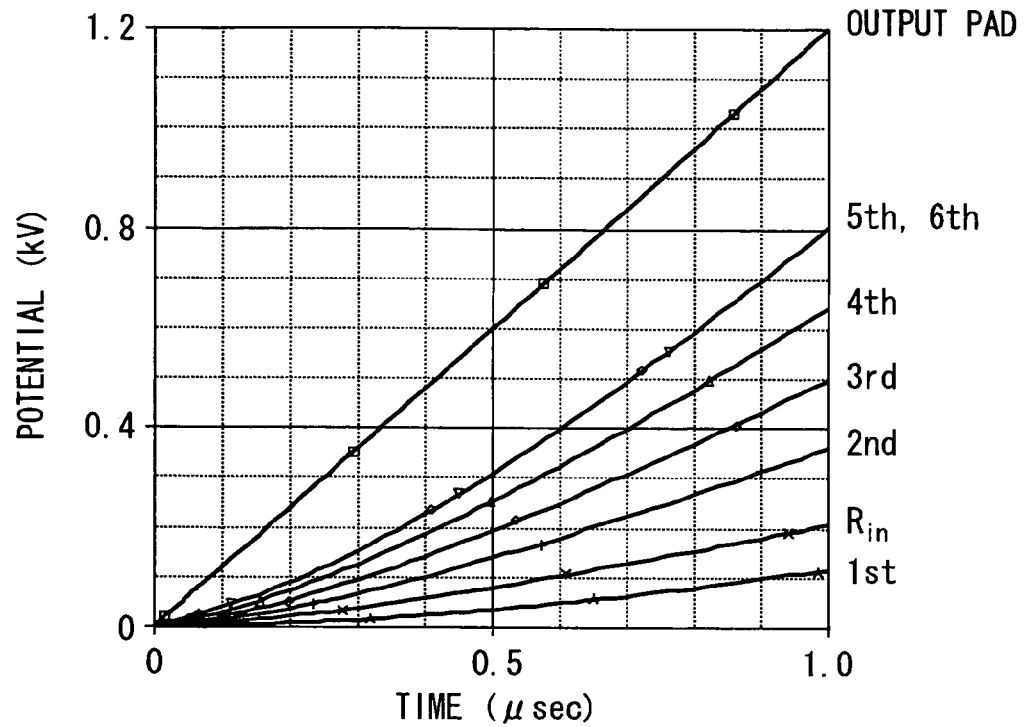
FIG. 18A is a graph showing a relation ship between a potential at each stage in the device and elapsed time in a case where a thickness of a buried oxide film is 10 µm.
Figure 18B:
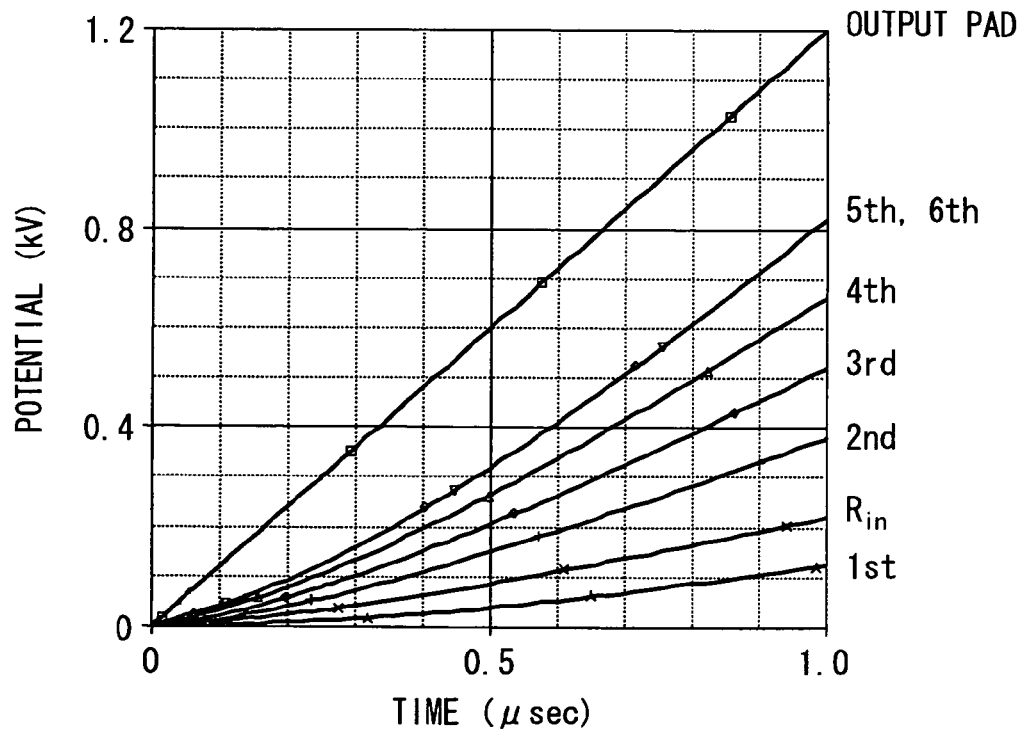
FIG. 18B is a graph showing a relation ship between a potential at each stage in the device and elapsed time in a case where a thickness of a buried oxide film is 12 µm.
Figure 19A:
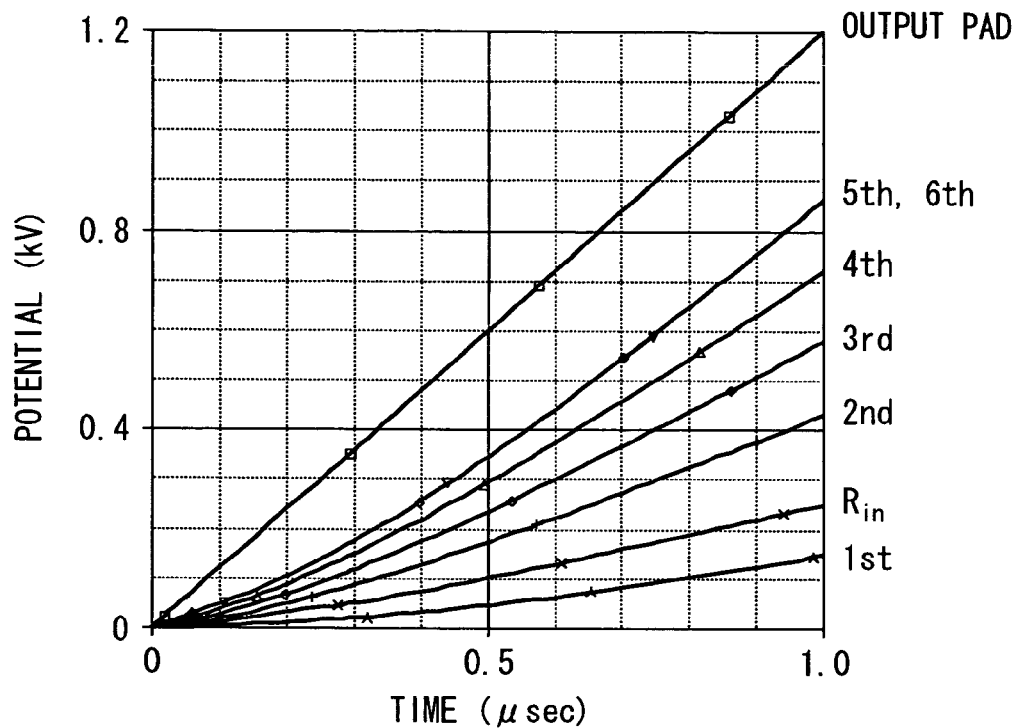
FIG. 19A is a graph showing a relation ship between a potential at each stage in the device and elapsed time in a case where a thickness of a buried oxide film is 20 µm.
Figure 19B:
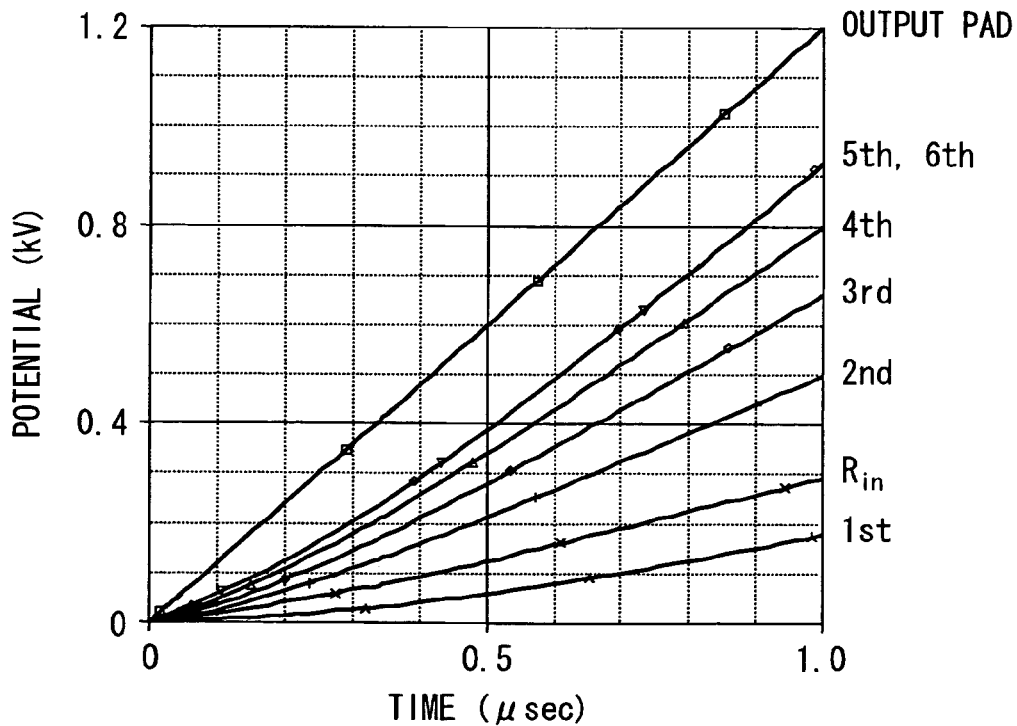
FIG. 19B is a graph showing a relation ship between a potential at each stage in the device and elapsed time in a case where a thickness of a buried oxide film is 50 µm.

Also FIG. 15 shows another embodiment of a semiconductor device which can suppress the flows of currents into a support substrate attributed to a dV/dt surge, and is a sectional view of a high voltage IC 102 (semiconductor device 19) which has a planar structure similar to that of the high voltage IC 100 (semiconductor device 10) in FIG. 33. By the way, in the high voltage IC 102 (semiconductor device 19) in FIG. 15, portions similar to the individual portions of the section of the high voltage IC 100 (semiconductor device 10) as shown in FIG. 34 are respectively assigned the same numerals and signs.

In the general SOI substrate 1 formed by the sticking of the substrates, for example, the SOI substrate 1 shown in FIG. 33, silicon oxide ($SiO_2$) whose relative dielectric constant is about 3.9 is employed for the buried oxide film 3. In contrast, the feature of the high voltage IC 102 (semiconductor device 19) shown in FIG. 15 consists in that an SOI substrate 1Y includes a buried oxide film 3a whose relative dielectric constant is smaller than 3.9.

Also in the semiconductor device 19 shown in FIG. 15, the voltage between a GND potential and a predetermined potential is divided by n transistor elements $Tr_1$-$Tr_n$, and the individual transistor elements $Tr_1$-$Tr_n$ at first through nth stages bear respectively corresponding voltage ranges. Accordingly, a DC breakdown voltage required of each of the transistor elements $Tr_1$-$Tr_n$ can be lowered as compared with a DC breakdown voltage in the case where the voltage between the GND potential and the predetermined potential is borne by a single transistor element.

Besides, the relative dielectric constant of the buried oxide film 3a of the SOI substrate 1Y employed for the formation of the semiconductor device 19 has a value smaller than the relative dielectric constant, 3.9 of the general silicon oxide ($SiO_2$). For this reason, the coupling of the buried oxide film 3a with the side of a support substrate 2 is weaker than in the case where the buried oxide film is made of the general $SiO_2$ whose relative dielectric constant is 3.9, so that the flows of dV/dt surge currents generated on an output side, into the support substrate 2 are suppressed. Accordingly, the respective MOS transistor elements $Tr_1$-$Tr_n$ are less susceptible to the influence of the potential of the support substrate 2, so that the inclination of a potential attributed to the dV/dt surge lessens to improve a breakdown voltage against the surge.

In the above way, also the semiconductor device 19 shown in FIG. 15 can be made a semiconductor device which can ensure any required DC breakdown voltage, and which suppresses the inclination of the potential attributed the dV/dt surge generated on the output side and does not lead to circuit breakdown even in the case of the entry of the surge.

By the way, in the semiconductor device 19 shown in FIG. 15, the potential of a field region surrounded with a second insulating separation trench at the innermost periphery should preferably be fixed at a power source potential as will be explained later. Thus, in the case where the dV/dt surge has entered from the output side, the application of a larger dV/dt surge voltage with an inclination to an output resistor can be suppressed in comparison with dV/dt surge voltages, which are applied to the MOS transistors of the respective stages.

Next, a series of verification results based on simulations will be described as to the above advantages of the semiconductor device 19 which has been formed in the SOI substrate 1Y including the buried oxide film 3a of the relative dielectric constant smaller than 3.9.

First, using the equivalent circuit diagram of the semiconductor device 18 as shown in FIG. 8, the thickness of the buried oxide film 3 made of $SiO_2$ (relative dielectric constant of 3.9) was changed, and the changes-with-time of potentials at the individual points of the semiconductor device 18 on the occasion of the entry of a dV/dt surge were investigated. FIG. 16 is a table in which the circuit constants of capacitance portions as correspond to the respective thicknesses of the buried oxide films 3 in the simulation are put together, and values indicated in the table of FIG. 9 are employed as the other circuit constants in FIG. 8. Incidentally, a substrate resistance R_sub is set at 1Ω by supposing the general resistance level of a silicon substrate.

FIGS. 17A and 17B, FIGS. 18A and 18B, and FIGS. 19A and 19B show simulation results, and they are diagrams showing the changes-with-time of the potentials at the individual points of the semiconductor device 18 as are attributed to the surge input, as to those samples of the semiconductor device 18 in FIG. 8 which have had the same configuration as in FIG. 35, but whose buried oxide films 3 have had the respectively different thicknesses as indicated in FIG. 16. FIGS. 17A, 17B, 18A, 18B, 19A and 19B correspond to 3 μm, 5 μm, 10 μm, 12 μm, 20 μm and 50 μm in terms of the thicknesses of the buried oxide films 3, respectively. Besides, FIG. 20 is a diagram in which the simulation results in FIG. 17A -FIG. 19B are put together, and in which the ratios between the maximum potential differences and an equal distribution value (200V) in the respective figures are taken and graphically shown versus the thicknesses of the buried oxide films 3.

Figure 20:
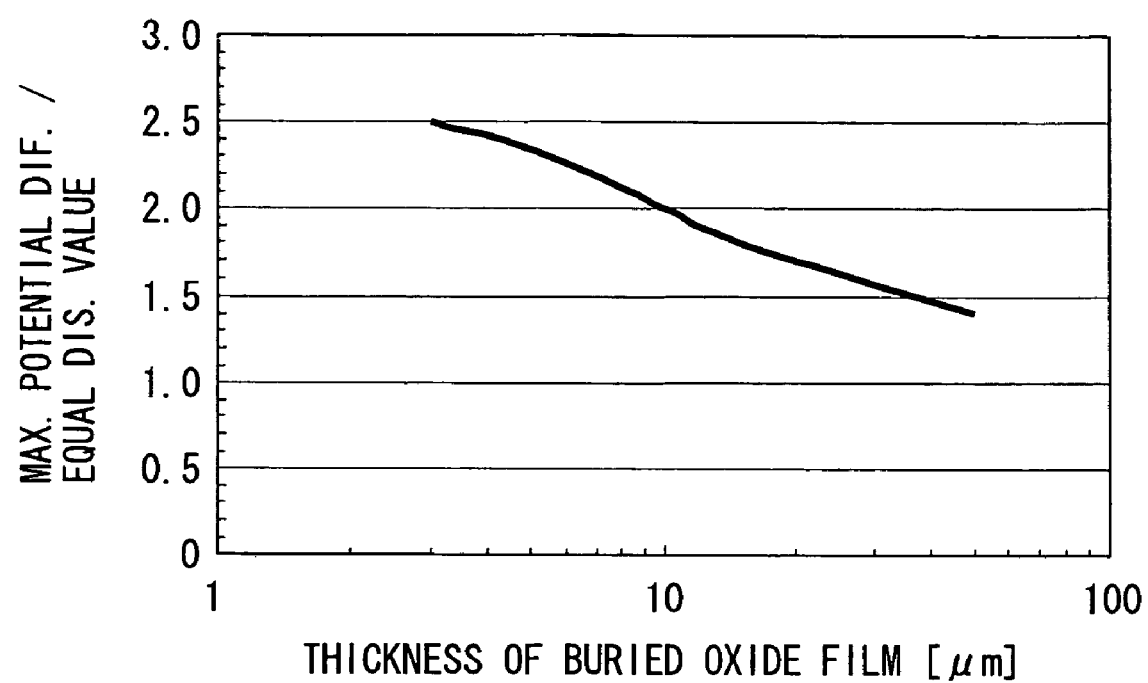
FIG. 20 is a graph showing a relationship between a thickness of a buried oxide film and a ratio between a maximum potential difference and an equal distribution value (i.e., 200V)
Figure 21A:
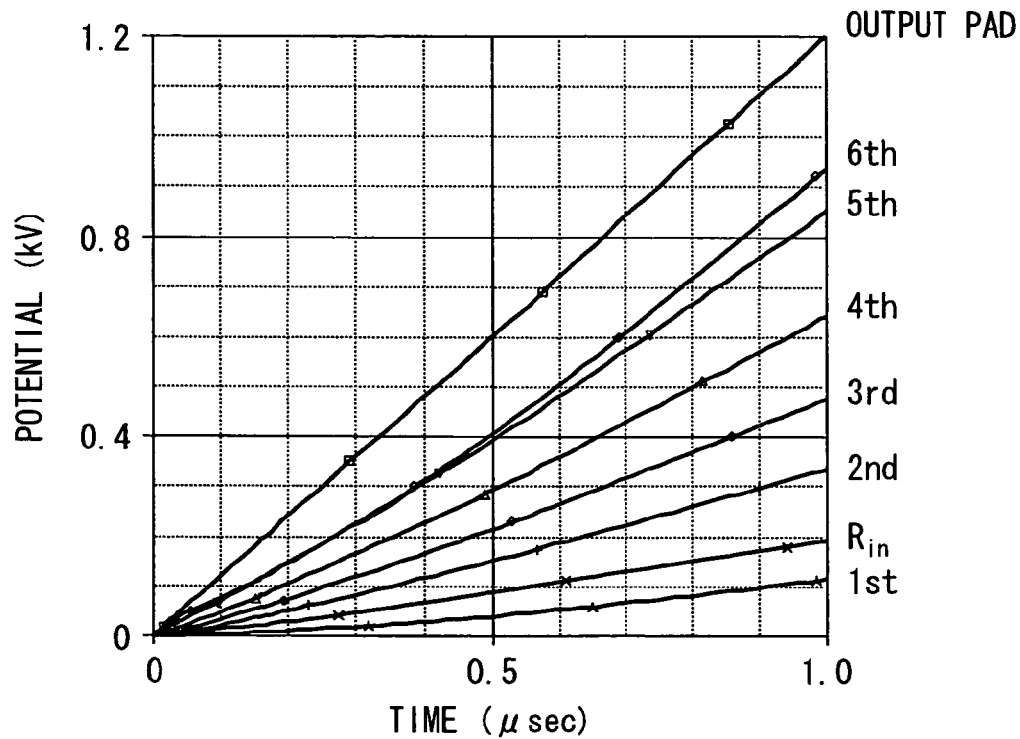
FIG. 21A is a graph showing a relation ship between a potential at each stage in the device and elapsed time in a case where a thickness of a buried oxide film is 3 µm and a field region F6 is connected to a power source.
Figure 21B:
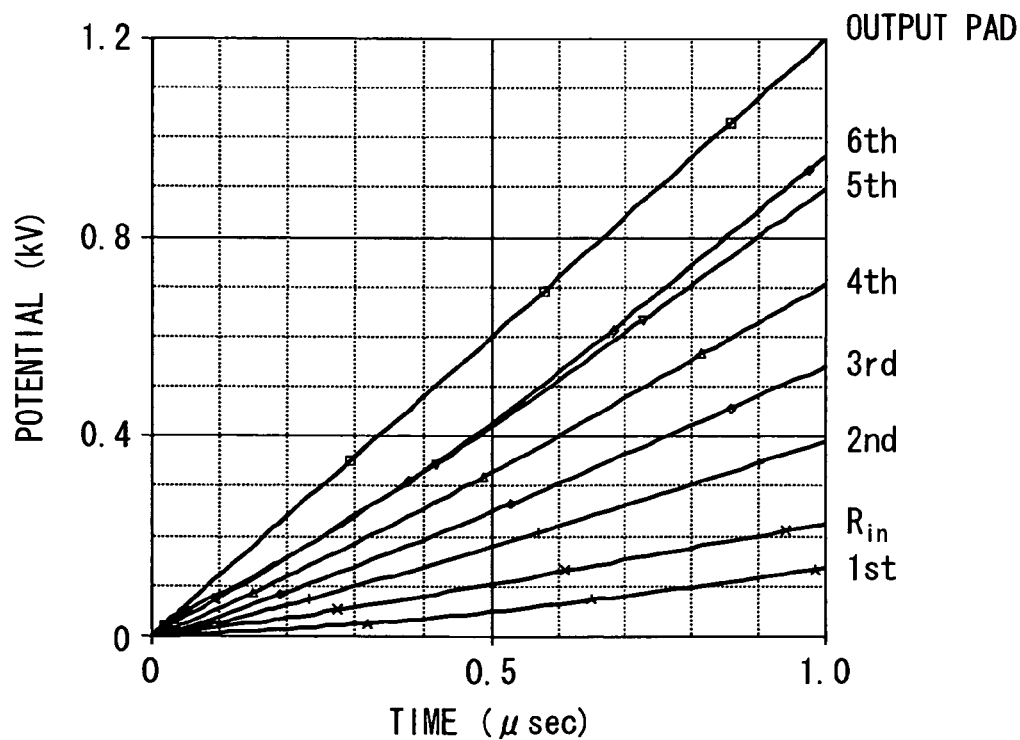
FIG. 21B is a graph showing a relation ship between a potential at each stage in the device and elapsed time in a case where a thickness of a buried oxide film is 5 µm and a field region F6 is connected to a power source.
Figure 22A:
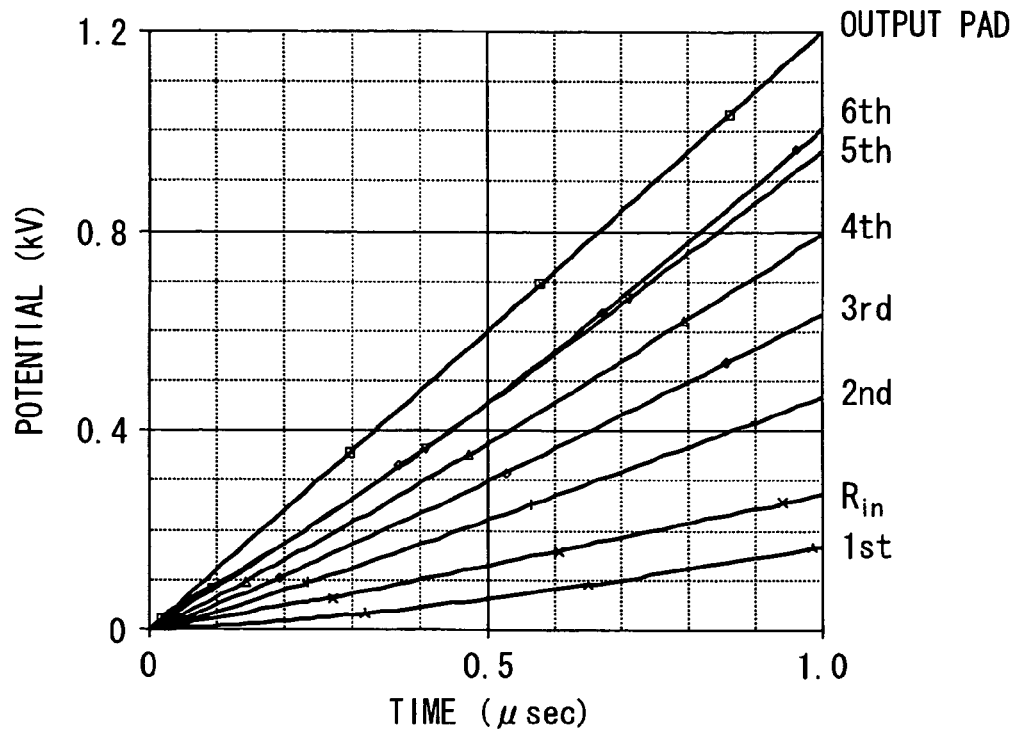
FIG. 22A is a graph showing a relation ship between a potential at each stage in the device and elapsed time in a case where a thickness of a buried oxide film is 10 µm and a field region F6 is connected to a power source.
Figure 22B:
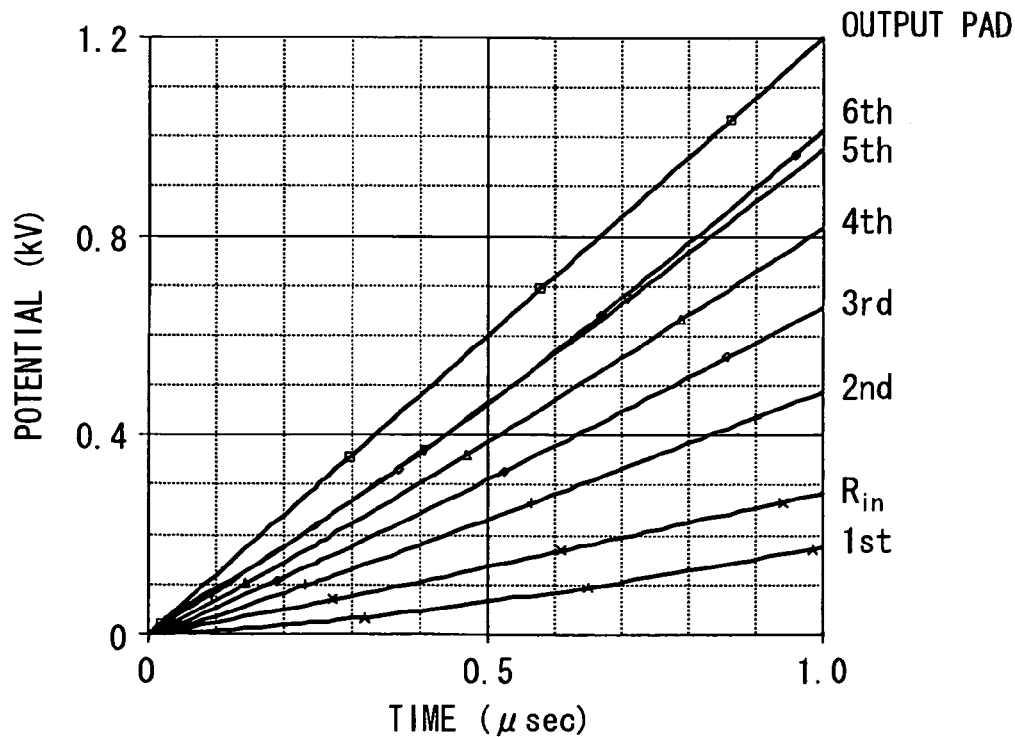
FIG. 22B is a graph showing a relation ship between a potential at each stage in the device and elapsed time in a case where a thickness of a buried oxide film is 12 µm and a field region F6 is connected to a power source.
Figure 23A:
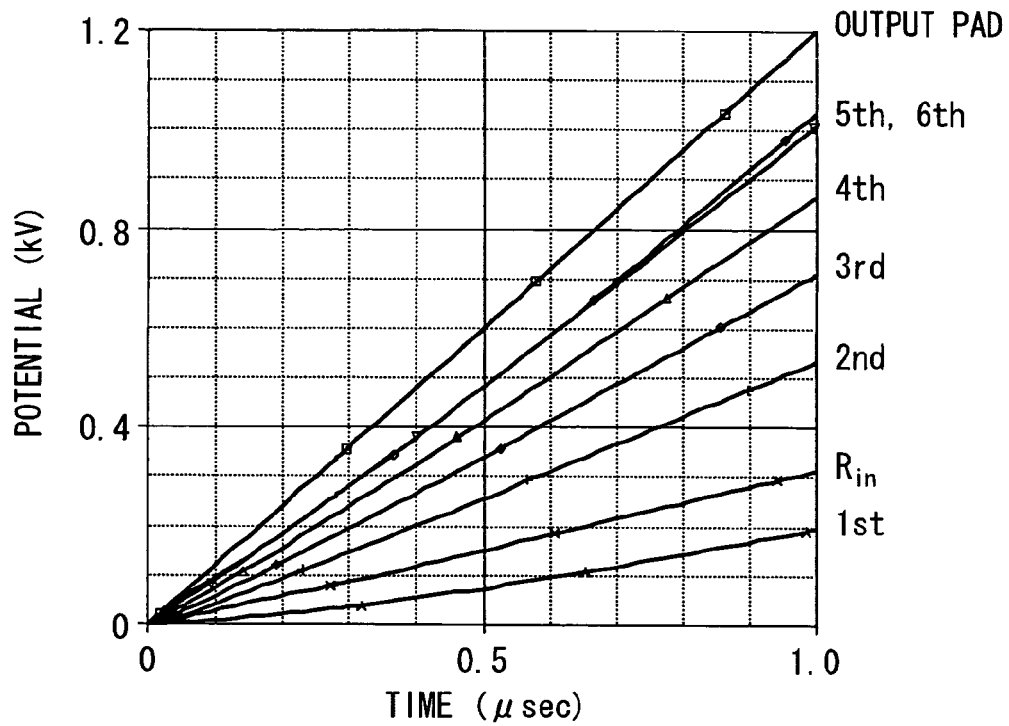
FIG. 23A is a graph showing a relation ship between a potential at each stage in the device and elapsed time in a case where a thickness of a buried oxide film is 20 µm and a field region F6 is connected to a power source.
Figure 23B:
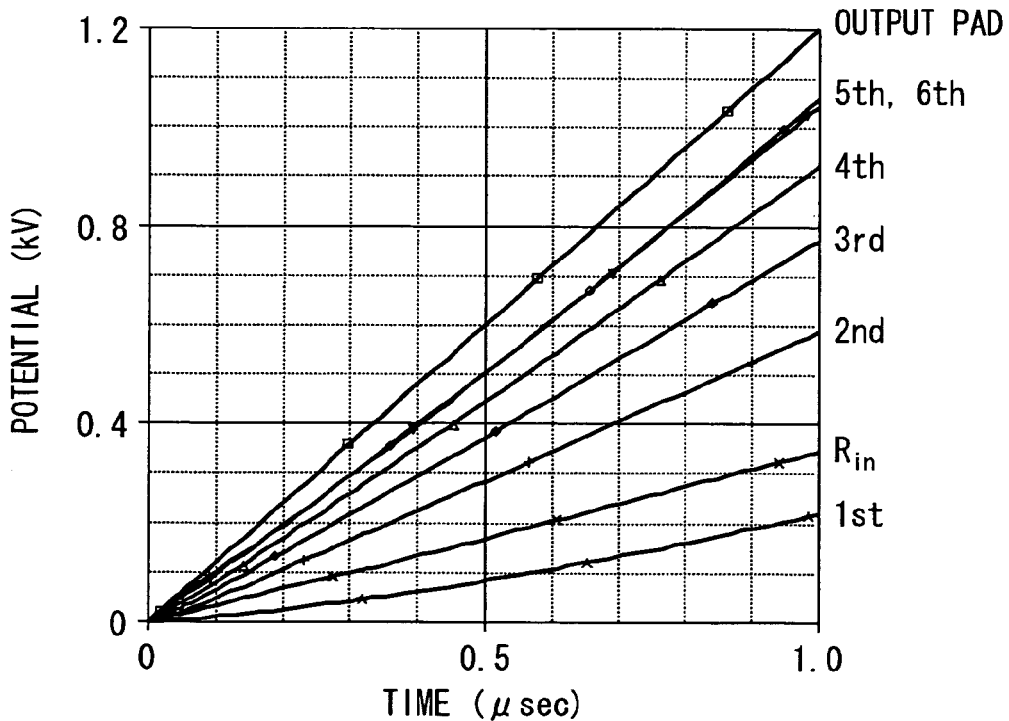
FIG. 23B is a graph showing a relation ship between a potential at each stage in the device and elapsed time in a case where a thickness of a buried oxide film is 50 µm and a field region F6 is connected to a power source.

As seen from FIG. 20, as the thickness of the buried oxide film 3 made of the $SiO_2$ (relative dielectric constant of 3.9) becomes larger, the distribution of the potentials at the individual points approximates to an equal distribution more. With the SOI substrate employing the buried oxide film 3 made of the $SiO_2$, however, the equal distribution is not reached even at the thickness (50 μm ) which exceeds the substantial upper-limit thickness of 5 μm, in relation to a warp, etc.

Next, regarding a case where, in the simulations in which the thickness of the buried oxide film 3 made of the $SiO_2$ was changed, the potential of the field region 6 surrounded with the second insulating separation trench Z2 of the sixth stage at the innermost periphery was fixed at the power source potential, the field region F6 was connected to the power source potential in the same manner as in FIGS. 1 and 2, and the changes-with-time at the individual points of the semiconductor device 19 were investigated.

Figure 24:
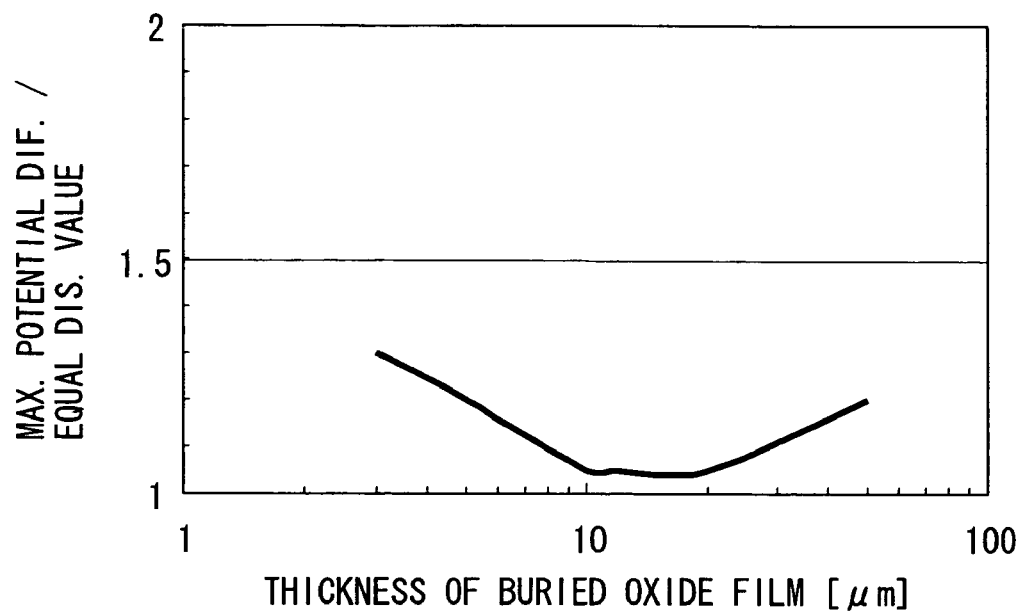
FIG. 24 is a graph showing a relationship between a thickness of a buried oxide film and a ratio between a maximum potential difference and an equal distribution value (i.e., 200V)

FIGS. 21A and 21B, FIGS. 22A and 22B, and FIGS. 23A and 23B show simulation results, and they are diagrams showing the changes-with-time of the potentials at the individual points as are attributed to the surge input. Samples in FIGS. 21A, 21B, 22A, 22B, 23A and 23B correspond to 3 μm, 5 μm, 10 μm, 12 μm, 20 μm and 50 μm in terms of the thicknesses of the buried oxide films 3, respectively. Besides, FIG. 24 is a diagram in which the simulation results in FIG. 21A-FIG. 23B are put together, and in which the ratios between the maximum potential differences and an equal distribution value (200 V) in the respective figures are taken and graphically shown versus the thicknesses of the buried oxide films 3.

When the graphs of the respective thicknesses of the buried oxide films as shown in FIG. 21A-FIG. 23B are compared with the graphs as shown in FIG. 17A-FIG. 19B, it is understood that the distribution of the potentials at the individual points approximates to the equal distribution, owing to the fixation of the potential of the field region F6 of the sixth stage to the power source potential. Besides, as shown in FIG. 24, the distribution of the potentials at the individual points approximates to the equal distribution, and a position at which the maximum potential difference is generated moves, so that the ratio between the maximum potential difference and the equal distribution value (200 V) comes to assume the minimum value in a range of 10-20 μm versus the thickness of the buried oxide film.

On the other hand, as stated before, the substantial upper-limit thickness of the buried oxide film is 5 μm in relation to the warp, etc., and the film thickness range of 10-20 μm in which the ratio between the maximum potential difference and the equal distribution value assumes the minimum value is not actual, either. Therefore, in view of the fact that, as indicated in FIG. 16, when the thickness of the buried oxide film is increased, the capacitances corresponding to each film thickness decreases, the thickness of the buried oxide film is set at 5 μm, and the capacitances are decreased by changing the material (relative dielectric constant) of the buried oxide film. Thus, the same advantages as in case of equivalently thickening the buried oxide film are attained.

Figure 25:
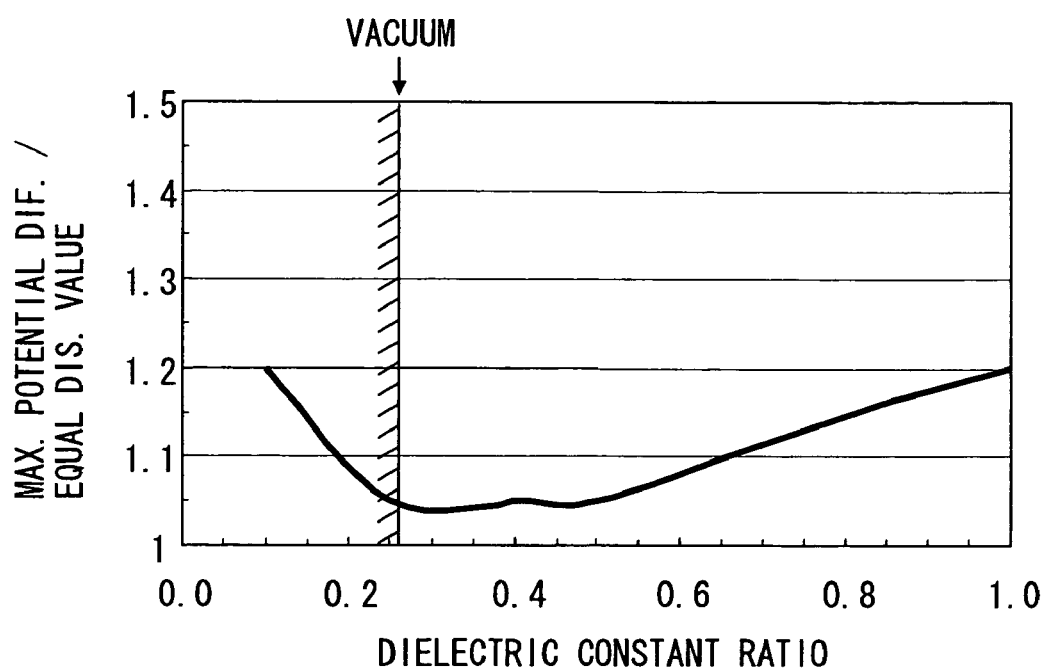
FIG. 25 is a graph showing a relationship between a dielectric constant ratio to a $SiO_2$ buried oxide film (i.e., a relative dielectric constant is 3.9) and a ratio between a maximum potential difference and an equal distribution value (i.e., 200V) in a case where the thickness of the buried oxide film is 5 µm, wherein vacuum represents a relative dielectric constant of vacuum.

FIG. 25 graphically shows the ratios between the maximum potential differences and an equal distribution value (200 V), as to the case where the thickness of the buried oxide film was 5 μm, and where the material (relative dielectric constant) of the buried oxide film was changed. Incidentally, the axis of abscissas in FIG. 25 represents values in terms of dielectric constant ratios to the $SiO_2$ (relative dielectric constant of 3.9) of the buried oxide film. The numerical value of 1.0 on the axis of abscissas corresponds to the relative dielectric constant of 3.9, while the numerical value of about 0.26 on the axis of abscissas corresponds to the relative dielectric constant, 1.0 of vacuum. Accordingly, any material whose numerical value on the axis of abscissas is smaller than 0.26 is not existent.

As shown in FIG. 25, the distribution of potentials approaches to the equal distribution value more as the numerical value on the axis of abscissas becomes smaller than 1.0, and the ratio between the maximum potential difference and the equal distribution value (200 V) assumes the minimum value within a range in which the numerical value on the axis of abscissas is 0.26 to 0.53 inclusive, that is, within a range in which the relative dielectric constant is at least 1 and at most 2.

In the above way, the advantages of the semiconductor device 19 which is formed in the SOI substrate 1Y that includes the buried oxide film 3a having the relative dielectric constant smaller than 3.9 as shown in FIG. 15 have been verified by the simulations. Incidentally, the simulation results shown in FIG. 25 reveal that the relative dielectric constant of the buried oxide film 3a should preferably be at most 2 in the semiconductor device 19 in FIG. 15. Thus, a coupling suppression effect can be attained to the same degree as in the case where the buried oxide film 3a is held in the vacuum (at the relative dielectric constant of 1), and the inclination of the potential attributed to the dV/dt surge can be minimized.

The buried oxide film 3a whose relative dielectric constant is smaller than 3.9 can be formed of any of, for example, nano-crystallized silicon oxide, carbonated silicon oxide (SiOC) and fluorinated silicon oxide (SiOF). Besides, the relative dielectric constant can be lowered by making the buried oxide film 3a porous. In a wide variety of materials, the relative dielectric constant of the porous film can be set at several tens % of that of the silicon oxide film. The buried oxide film 3a whose relative dielectric constant is smaller than 3.9 should desirably be equivalent in $SiO_2$ or its composition to the SOI layers 1a or support substrate 2 made of silicon, in view of the functions of a close adhesion property and an insulating property, but it can be selected at will as long as no problem is posed in performances including the insulating property, a strength, etc.

Figure 26:
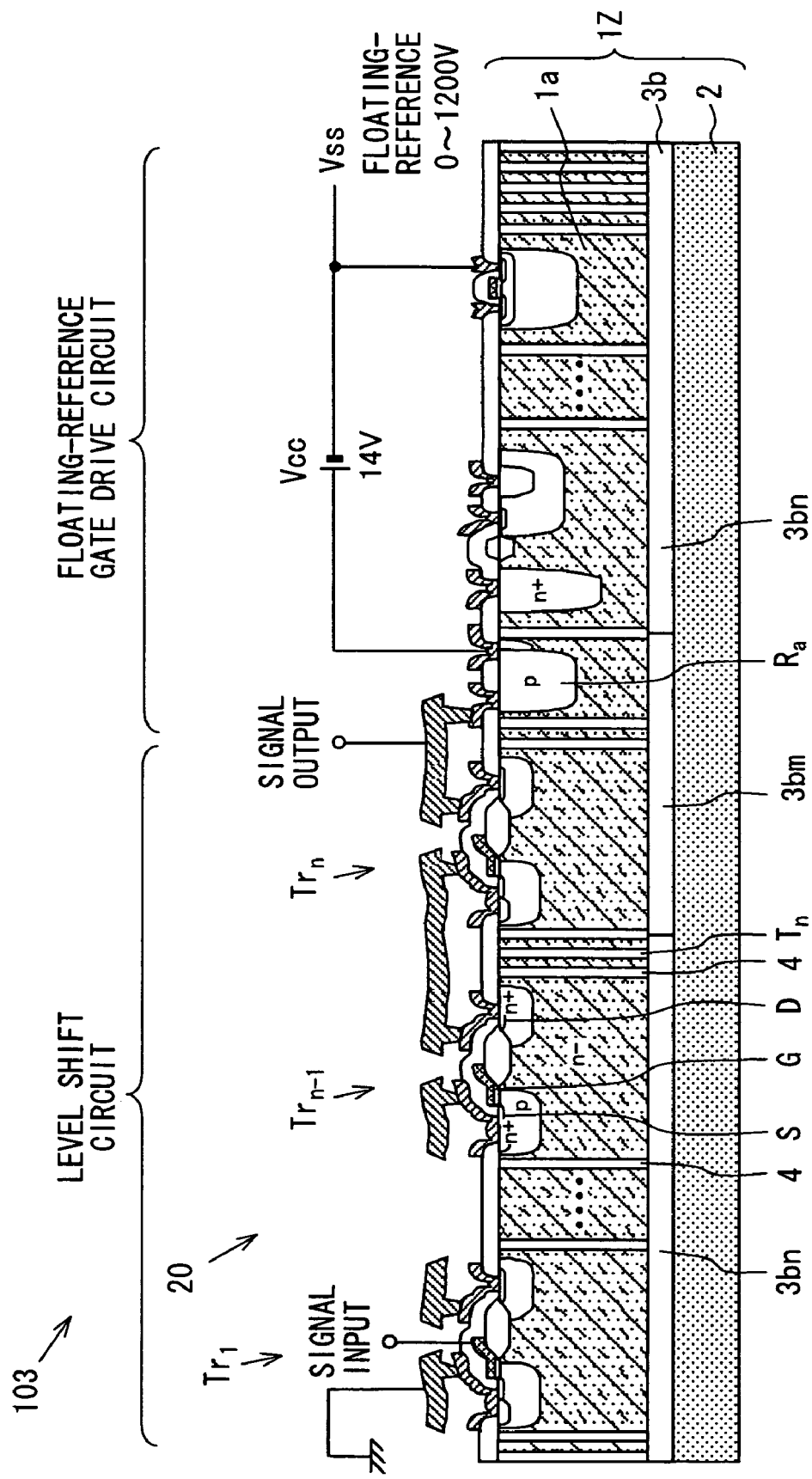
FIG. 26 is a cross sectional view showing another semiconductor device for limiting current flow of dV/dt surge into a substrate.
Figure 27A:
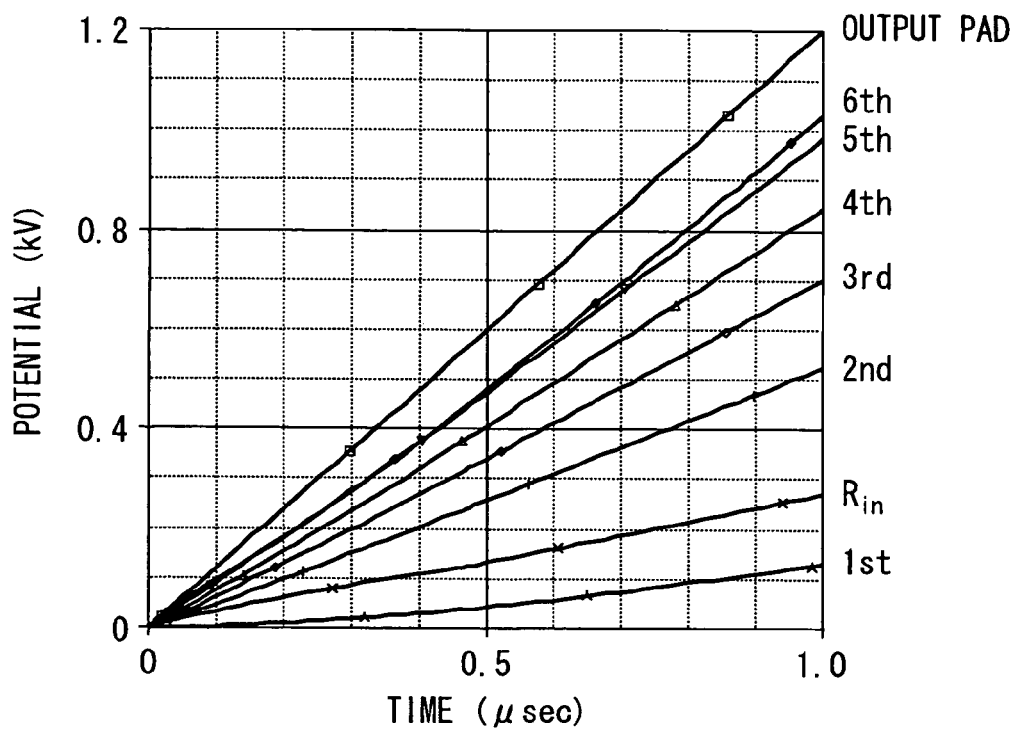
FIG. 27A is a graph showing a relation ship between a potential at each stage in the device and elapsed time in a case where a relative dielectric constant of a region $3bm$ is $3.9 \times 1.0$.
Figure 27B:
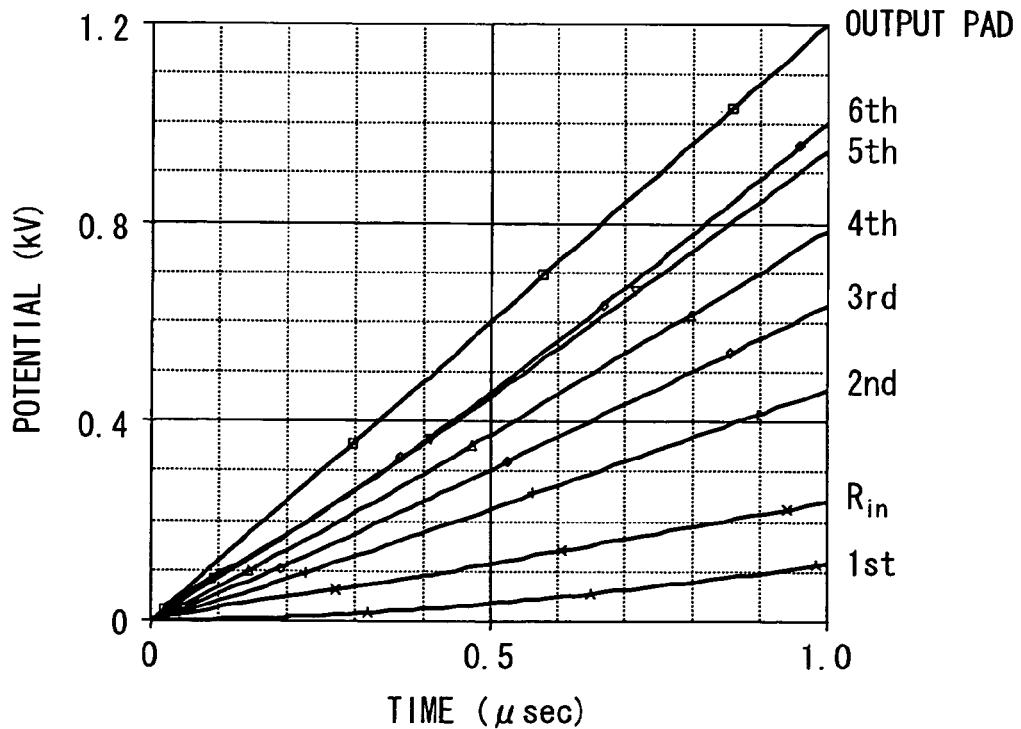
FIG. 27B is a graph showing a relation ship between a potential at each stage in the device and elapsed time in a case where a relative dielectric constant of a region $3bm$ is $3.9 \times 0.8$.
Figure 28A:
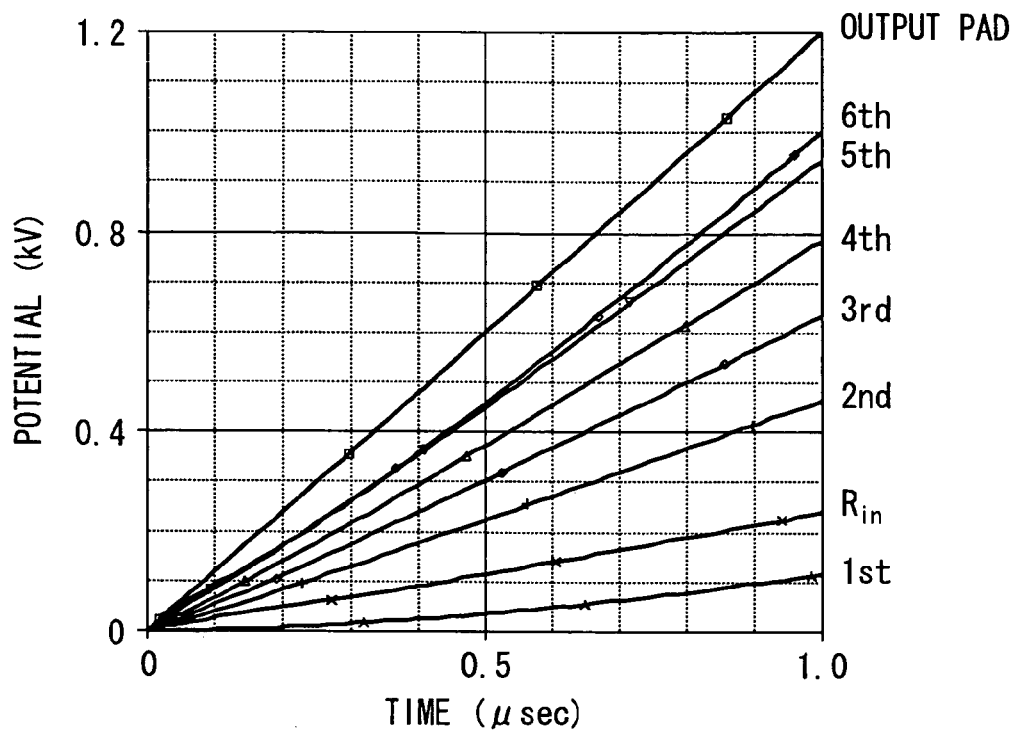
FIG. 28A is a graph showing a relation ship between a potential at each stage in the device and elapsed time in a case where a relative dielectric constant of a region $3bm$ is $3.9 \times 0.6$.
Figure 28B:
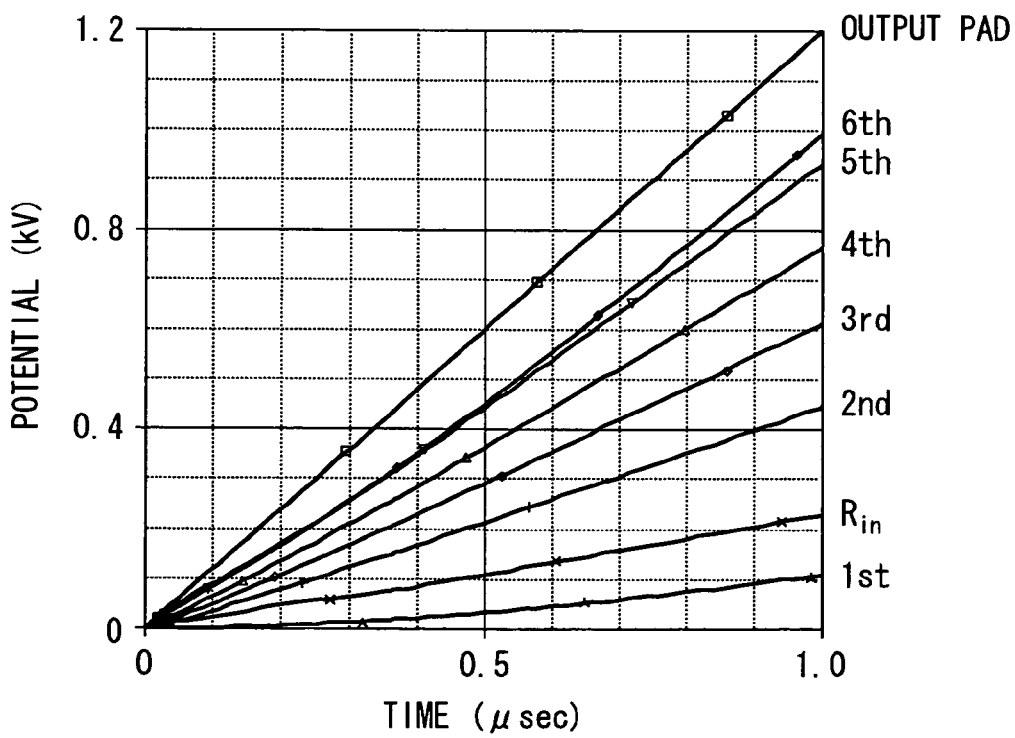
FIG. 28B is a graph showing a relation ship between a potential at each stage in the device and elapsed time in a case where a relative dielectric constant of a region $3bm$ is $3.9 \times 0.5$.
Figure 29A:
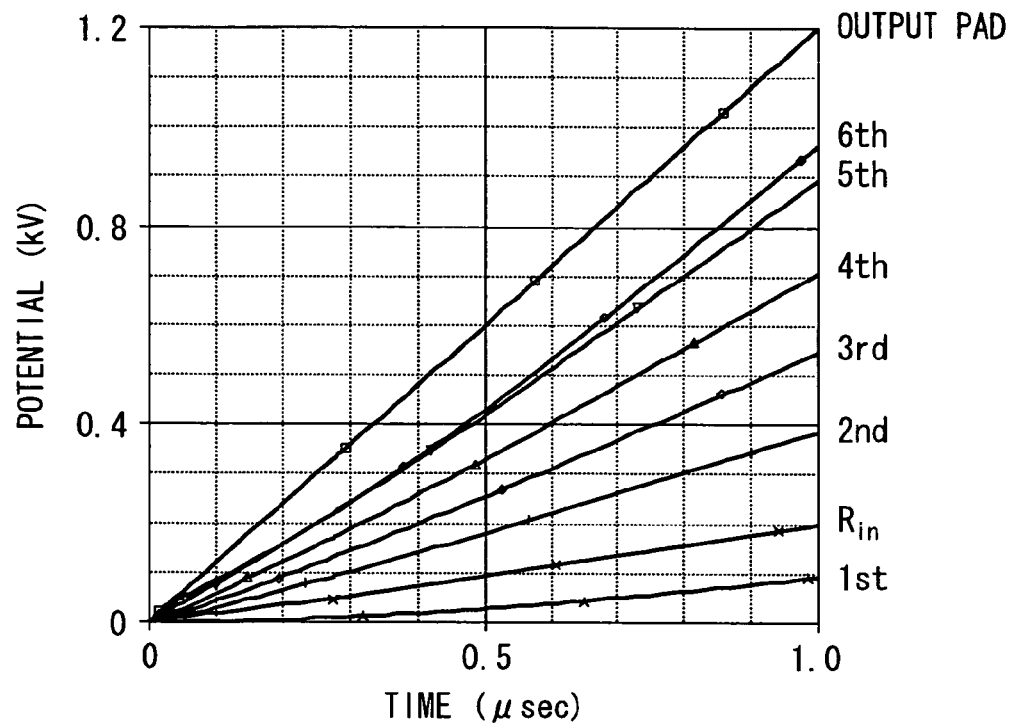
FIG. 29A is a graph showing a relation ship between a potential at each stage in the device and elapsed time in a case where a relative dielectric constant of a region $3bm$ is $3.9 \times 0.25$.
Figure 29B:
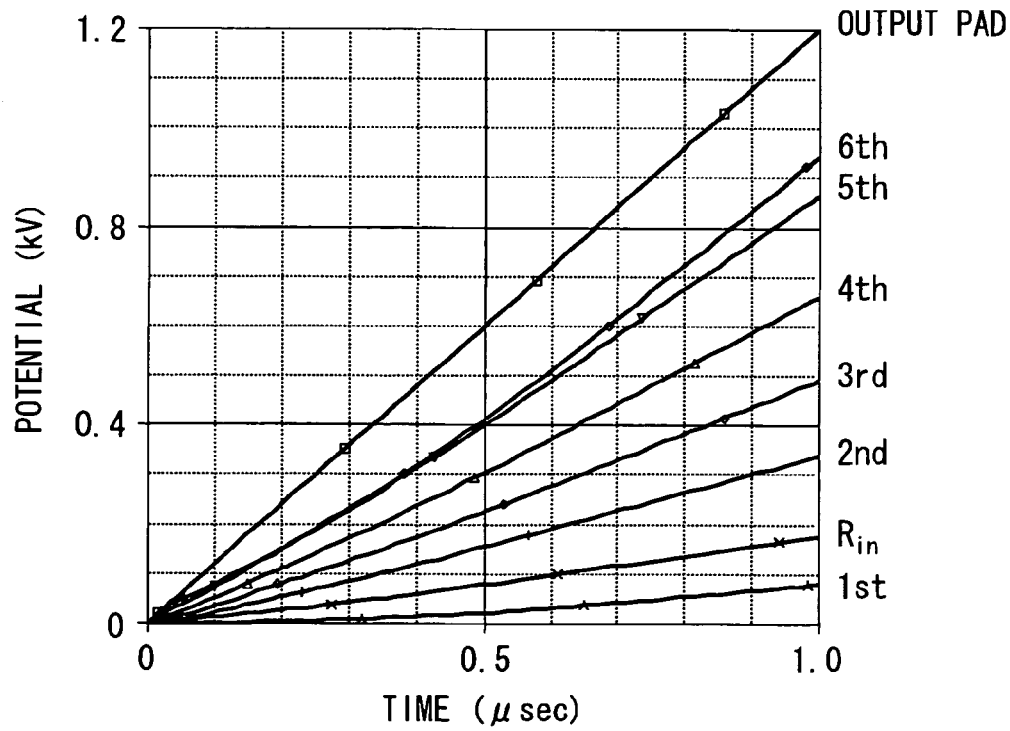
FIG. 29B is a graph showing a relation ship between a potential at each stage in the device and elapsed time in a case where a relative dielectric constant of a region $3bm$ is $3.9 \times 0.1$.

FIG. 26 shows another embodiment of a semiconductor device, and is a sectional view of a high voltage IC 103 (semiconductor device 20). By the way, in the high voltage IC 103 (semiconductor device 20) in FIG. 26, portions similar to the individual portions of the section of the high voltage IC 102 (semiconductor device 19) as shown in FIG. 15 are respectively assigned the same numerals and signs.

In the high voltage IC 102 (semiconductor device 19) in FIG. 15, the SOI substrate 1Y has included the unitary buried oxide film 3a whose relative dielectric constant is smaller than 3.9. In contrast, in the high voltage IC 103 (semiconductor device 20) in FIG. 26, the buried oxide film 3b of an SOI substrate 1Z includes regions 3bm and 3bn whose relative dielectric constants are different. In more detail, in the high voltage IC 103 (semiconductor device 20) in FIG. 26, the potential of a field region surrounded with a second insulating separation trench at the innermost periphery is fixed at a power source potential in the same manner as in FIGS. 1 and 2, and the relative dielectric constant of the buried oxide film (region 3bm) directly under the field region fixed at the power source potential is made lower as compared with the relative dielectric constant of the surrounding buried oxide film (region 3bn).

By the way, in a case, for example, where the surrounding buried oxide film (region 3bn) is made of $SiO_2$ whose relative dielectric constant is 3.9, the buried oxide film (region 3bm) directly under the field region whose relative dielectric constant is smaller than 3.9 and which is fixed at the power source potential can be formed of any of nano-crystallized silicon oxide, carbonated silicon oxide (SiOC) and fluorinated silicon oxide (SiOF), as stated before. Besides, the relative dielectric constant can be lowered by making the buried oxide film 3bm porous.

By way of example, the high voltage IC 103 (semiconductor device 20) in FIG. 26 can be manufactured as stated below. In an SOI formation process, the front surface of a support substrate 2 made of silicon is thermally oxidized, only the part of the buried oxide film (region 3*bm*) directly under the field region to be fixed at the power source potential is thereafter etched and removed, and a porous oxide film is thereafter buried and flattened. Subsequently, another silicon substrate to become a region for forming transistor elements (SOI layers 1*a*) is stuck to the resulting support substrate 2, thereby to configure an SOI structure.

For forming the transistor elements, the region 3*bm* formed on the side of the support substrate 2 and the field region to be fixed at the power source potential need to be registered. This is achieved by, for example, a method in which, immediately after the step of etching the region 3*bm*, a mark which permits an alignment at a photolithographic step is affixed on the rear surface of the silicon. Alternatively, a mark for photolithography may be worked in the rear surface beforehand, so as to perform the buried oxide film etching at the SOI formation, in conformity with the mark. This mark may be used for only a first mask layer (for example, an alignment mask) at the transistor element formation, and it may be in a shape at a degree at which it disappears by the subsequent wafer process, so that it does not exert evil influence on the final performance of the transistor elements.

Also in the semiconductor device 20 shown in FIG. 26, the voltage between a GND potential and the predetermined potential is divided by the n transistor elements $Tr_1$-$Tr_n$, and the individual transistor elements $Tr_1$-$Tr_n$ at first through nth stages bear respectively corresponding voltage ranges. Accordingly, a DC breakdown voltage required of each of the transistor elements $Tr_1$-$Tr_n$ can be lowered as compared with a DC breakdown voltage in the case where the voltage between the GND potential and the predetermined potential is borne by a single transistor element.

In addition, with the buried oxide film 3*b* of the SOI substrate 1Z for use in the formation of the semiconductor device 20 in FIG. 26, the relative dielectric constant of the buried oxide film (region 3*bm*) directly under the field region which is fixed at the power source potential and which is surrounded with the second insulating separation trench at the innermost periphery is made lower as compared with the relative dielectric constant of the surrounding buried oxide film (region 3*bn*) made of, for example, general silicon oxide. For this reason, coupling with the side of the support substrate 2 in that buried oxide film (region 3*bm*) directly under the field region fixed at the power source potential which is most influential in a case where dV/dt surge currents generated on an output side flow into the support substrate 2 is made weaker than in the surroundings. In this manner, the flows of the dv/dt surge currents generated on the output side, into the support substrate 2 can be suppressed, not only by lowering the relative dielectric constant of the whole buried oxide film as explained before, but also by making the relative dielectric constant of the buried oxide film of the greatly influential part lower than in the surroundings. Accordingly, the MOS transistor elements $Tr_1$-$Tr_n$ become less susceptible to the influence of the potential of the support substrate 2, and the inclination of the potential attributed to the dV/dt surge is lessened, so that the breakdown voltage against the surge is improved.

In the above way, also the semiconductor device 20 shown in FIG. 26 can be made a semiconductor device which can ensure any required DC breakdown voltage, and which suppresses the inclination of the potential attributed to the dV/dt surge generated on the output side and does not lead to circuit breakdown even in the case of the entry of the surge.

Next, regarding the advantages of the semiconductor device 20 in FIG. 26, verification results based on simulations similar to those stated above will be described.

Figure 30:
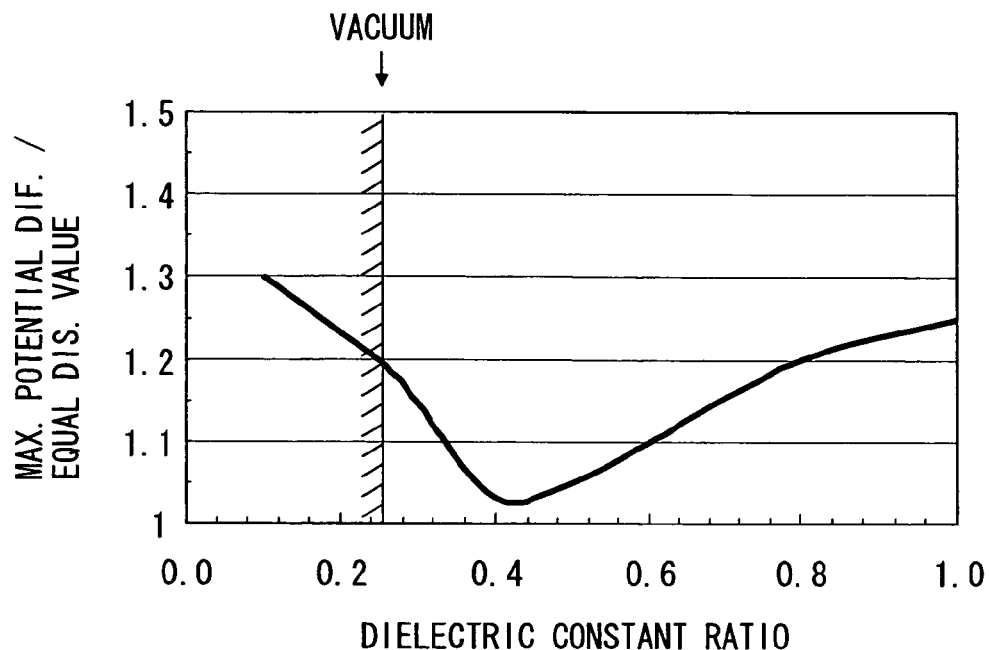
FIG. 30 is a graph showing a relationship between a dielectric constant ratio to a $SiO_2$ region $3bm$ (i.e., a relative dielectric constant is 3.9) and a ratio between a maximum potential difference and an equal distribution value (i.e., 200V) in a case where the thickness of the buried oxide film is 3 µm, wherein vacuum represents a relative dielectric constant of vacuum.

FIGS. 27A and 27B, FIGS. 28A and 28B, and FIGS. 29A and 29B show simulation results, and they are diagrams showing the changes-with-time of the potentials at individual points as are attributed to a surge input. Samples in FIGS. 27A, 27B, 28A, 28B, 29A and 29B correspond to ×1.0, ×0.8, ×0.6, ×0.5, ×0.25 and ×0.1 in terms of the dielectric constant ratios of the relative dielectric constants of the buried oxide films (region 3*bm* in FIG. 26) directly under the field regions fixed at the power source potential, to the $SiO_2$ (relative dielectric constant of 3.9) in the surroundings (region 3*bn* in FIG. 26), respectively. Besides, FIG. 30 is a diagram in which the simulation results in FIG. 27A-FIG. 29B are put together, and in which the ratios between the maximum potential differences and an equal distribution value (200 V) in the respective figures are taken and graphically shown versus the dielectric constant ratios of the regions 3*bm*. By the way, in the simulations of FIG. 27A-FIG. 29B, the potential of a field region surrounded with a second insulating separation trench at the outermost periphery is fixed at the GND potential, in addition to the fact that the potential of the field region surrounded with the second insulating separation trench at the innermost periphery is fixed at the power source potential.

Also in FIG. 30, as in FIG. 25, the distribution of potentials approaches to the equal distribution value more as the numerical value on the axis of abscissas becomes smaller than 1.0, and the ratio between the maximum potential difference and the equal distribution value (200 V) assumes the minimum value near 0.4 in terms of the numerical value on the axis of abscissas, that is, near 1.6 in terms of the relative dielectric constant.

In the above way, the verifications based on the simulations have been made on also the advantages of the semiconductor device 20 shown in FIG. 26, in which the potential of the field region surrounded with the second insulating separation trench at the innermost periphery is fixed at the power source potential, and in which the relative dielectric constant of the buried oxide film (region 3*bm*) directly under the field region fixed at the power source potential is made lower as compared with the relative dielectric constant of the surrounding buried oxide film (region 3*bn*).

As described above, each of the semiconductor devices 12-20 is the semiconductor device which can ensure any required DC breakdown voltage, and which suppresses the inclination of a potential attributed to a dV/dt surge generated on an output side and does not lead to circuit breakdown even in case of the entry of the surge.

In, for example, a high voltage IC for driving an inverter as includes a GND-reference-gate drive circuit which operates with reference to a GND potential, a floating-reference-gate drive circuit which operates with reference to a floating potential, and a level shift circuit which level-shifts input/output signals between the GND potential and the floating potential, each of the semiconductor devices 12-20 is well suited for application to the level shift circuit in which a predetermined power source potential is the floating potential. The high voltage IC may be, for example, either a high voltage IC for driving the inverter of an on-vehicle motor, or a high voltage IC for driving the inverter of an on-vehicle air conditioner. Besides, the high voltage IC is not restricted to them, but it is also applicable to the fields of the controls of home-use and industrial motors.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a SOI substrate having a SOI layer, a buried oxide layer and a support substrate, which are stacked in this order;
a plurality of first separation trenches disposed on the SOI layer and reaching the buried oxide layer;
a plurality of MOS transistors, each of which is surrounded with one of the first separation trenches so that the MOS transistor is isolated;
a second separation trench disposed on the SOI layer and reaching the buried oxide layer, wherein the second separation trench includes a plurality of field trenches, which are defined as first to n-th field trenches so that the second separation trench provides n-ply field trenches, and wherein n represents a predetermined natural number; and
a plurality of field regions surrounded with the second separation trench, wherein the field regions are defined as first to n-th field regions so that a k-th field region is surrounded with a k-th field trench, and wherein k is a natural number in a range between 1 and n, wherein
one of the MOS transistors surrounded with one of the first separation trenches is disposed in each field region so that a k-th MOS transistor is disposed in the k-th field region,
the MOS transistors are electrically connected in series between a ground potential and a predetermined power source potential,
the first field region is disposed on an utmost outside and on a ground potential side, and the n-th field region is disposed on an utmost inside and on a power source potential side,
the first MOS transistor in the first field region has a gate terminal, which provides an input terminal,
the n-th MOS transistor in the n-th field region is electrically connected to the power source potential through an output resistor so that an output signal is retrieved from a connection between the n-th MOS transistor and the output resistor, and
the n-th field region has an electric potential, which is fixed to the power source potential.

2. The device according to claim 1, wherein
the first field region has an electric potential, which is fixed to the ground potential.

3. The device according to claim 1, further comprising:
a plurality of hollows disposed in the support substrate, wherein
each hollow reaches the buried oxide layer, and faces the field region through the buried oxide layer.

4. The device according to claim 1, further comprising:
a hollow disposed in a part of the support substrate, the part which faces all field regions through the buried oxide layer, wherein
the hollow reaches the buried oxide layer.

5. The device according to claim 1, further comprising:
a plurality of third trenches disposed in the support substrate, wherein
each third trench reaches the buried oxide layer, and each third trench surrounds a part of the support substrate, the part which fasces the field region through the buried oxide layer.

6. The device according to claim 5, wherein
each third trench faces the field trench through the buried oxide layer so that the third trenches have a same planar pattern as the field trenches.

7. The device according to claim 1, wherein
the support substrate is made of silicon.

8. The device according to claim 1, wherein
the support substrate is made of resistance material other than silicon.

9. The device according to claim 8, wherein
the support substrate has a resistance between a part of the support substrate and an adjacent part of the support substrate,
the part of the support substrate faces one field region, and the adjacent part of the support substrate faces adjacent one field region, and
the resistance of the support substrate is equal to or larger than 100 k$\Omega$.

10. The device according to claim 1, wherein
the buried oxide layer includes a first buried oxide film and a second buried oxide film,
the first buried oxide film faces the n-th field region,
the second buried oxide film faces other field regions,
the first buried oxide film has a relative dielectric constant smaller than that of the second buried oxide film.

11. The device according to claim 10, wherein
the buried oxide layer is made of silicon oxide,
the first buried oxide film is made of nano-crystal oxide silicon, carbon including oxide silicon or fluorine including oxide silicon.

12. The device according to claim 10, wherein
the first buried oxide film is a porous film.

13. The device according to claim 10, wherein
the first field region has an electric potential, which is fixed to the ground potential.

14. The device according to claim 10, wherein
each MOS transistor has a same breakdown voltage.

15. The device according to claim 1, further comprising:
a ground reference gate drive circuit having a ground potential as a reference potential; and
a floating reference gate drive circuit having a floating potential as a reference potential, wherein
the floating potential is the power source potential,
the SOI substrate, the first separation trenches, the MOS transistors, the second separation trench and the field regions provide a level shift circuit,
the level shift circuit shifts a level of an input/output signal between the ground potential and the floating potential, and
the ground reference gate drive circuit, the floating reference gate drive circuit and the level shift circuit provide a high voltage IC for driving an inverter.

16. The device according to claim 15, wherein
the inverter is disposed in an in-vehicle motor.

17. The device according to claim 15, wherein
the inverter is disposed in an in-vehicle air-conditioner.

* * * * *